US011214585B2

(12) United States Patent
Islam et al.

(10) Patent No.: US 11,214,585 B2
(45) Date of Patent: Jan. 4, 2022

(54) LIGHT-EMITTING COMPOSITION

(71) Applicants: Cambridge Display Technology Limited, Godmanchester (GB); Sumitomo Chemical Company Limited, Tokyo (JP)

(72) Inventors: Nazrul Islam, Godmanchester (GB); Kazuei Ohuchi, Tokyo (JP); Martin Humphries, Godmanchester (GB)

(73) Assignees: Cambridge Display Technology Limited, Godmanchester (GB); Sumitomo Chemical Company Limited, Tokyo (JP)

( * ) Notice: Subject to any disclaimer, the term of this patent is extended or adjusted under 35 U.S.C. 154(b) by 546 days.

(21) Appl. No.: 16/062,855

(22) PCT Filed: Dec. 14, 2016

(86) PCT No.: PCT/GB2016/053936
§ 371 (c)(1),
(2) Date: Jun. 15, 2018

(87) PCT Pub. No.: WO2017/103586
PCT Pub. Date: Jun. 22, 2017

(65) Prior Publication Data
US 2019/0002629 A1    Jan. 3, 2019

(30) Foreign Application Priority Data
Dec. 15, 2015   (GB) ...................................... 1522147

(51) Int. Cl.
*H01L 51/50*      (2006.01)
*C07F 15/00*      (2006.01)
(Continued)

(52) U.S. Cl.
CPC .......... *C07F 15/0033* (2013.01); *C08G 61/12* (2013.01); *C08G 61/122* (2013.01);
(Continued)

(58) Field of Classification Search
None
See application file for complete search history.

(56) References Cited

U.S. PATENT DOCUMENTS

2013/0221332 A1\*   8/2013   Xia ..................... H01L 51/0035
                                                                257/40
2015/0001471 A1\*   1/2015   Boudreault .......... C07D 403/04
                                                                257/40

FOREIGN PATENT DOCUMENTS

JP    2010-031246 A    2/2010
JP    2013-543864 A    12/2013
(Continued)

OTHER PUBLICATIONS

International Search Report and Written Opinion for International Application No. PCT/GB2016/053936, dated Mar. 3, 2017.
(Continued)

*Primary Examiner* — Gregory D Clark
(74) *Attorney, Agent, or Firm* — Wolf, Greenfield & Sacks, P.C.

(57) ABSTRACT

Light-Emitting Compound A composition comprising a light-emitting compound having a peak wavelength of at least 650 nm and a material comprising a group of formula (I): wherein $Ar^1$, $Ar^2$ and $Ar^3$ in each occurrence are independently selected from a $C_{6-20}$ aromatic group and a 6-20 membered heteroaromatic group of C and N ring atoms and at least one of $Ar^1$, $Ar^2$ and $Ar^3$ is a 6-20 membered heteroaromatic group of C and N ring atoms; x, y and z are each independently at least 1; n, m and p are each indepen-
(Continued)

dently 0 or a positive integer; and $R^1$, $R^2$ and $R^3$ in each occurrence is independently a substituent or a single bond to a polymer chain, wherein the group of formula (I) has no more than 3 single bonds to a polymer chain. The composition may be used in the light-emitting layer of an infrared organic light-emitting device.

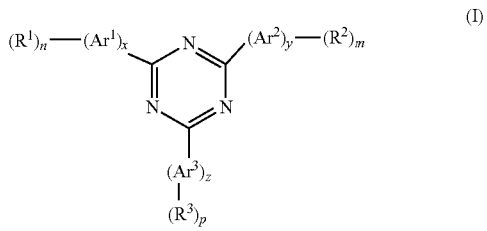

(I)

19 Claims, 2 Drawing Sheets

(51) Int. Cl.
*H01L 51/00* (2006.01)
*C09K 11/06* (2006.01)
*C08G 61/12* (2006.01)
*C09D 165/00* (2006.01)
*C08K 5/00* (2006.01)
*H01L 51/52* (2006.01)

(52) U.S. Cl.
CPC .......... *C08K 5/0091* (2013.01); *C09D 165/00* (2013.01); *C09K 11/06* (2013.01); *H01L 51/0035* (2013.01); *H01L 51/0085* (2013.01); *H01L 51/5016* (2013.01); *H01L 51/5092* (2013.01); *H01L 51/5206* (2013.01); *H01L 51/5221* (2013.01); *C08G 2261/148* (2013.01); *C08G 2261/1412* (2013.01); *C08G 2261/3142* (2013.01); *C08G 2261/3162* (2013.01); *C08G 2261/3221* (2013.01); *C08G 2261/411* (2013.01); *C08G 2261/5242* (2013.01); *C08G 2261/95* (2013.01); *C09K 2211/185* (2013.01); *H01L 51/5056* (2013.01); *H01L 51/5072* (2013.01)

(56) References Cited

FOREIGN PATENT DOCUMENTS

| KR | 2014006711 | * | 1/2014 | ............ C09K 11/06 |
|----|-----------|---|--------|-------------------------|
| WO | WO 2009/157430 A1 | | 12/2009 | |
| WO | WO 2015/008851 A1 | | 1/2015 | |
| WO | WO 2015/105014 A1 | | 7/2015 | |
| WO | WO 2015/159744 A1 | | 10/2015 | |

OTHER PUBLICATIONS

Combined Search and Examination Report for British Application No. 1522147.6, dated Oct. 7, 2016.
Japanese Office Action dated Nov. 24, 2020 in connection with JP Application No. 2018-530844.

* cited by examiner

LIGHT-EMITTING COMPOSITION

RELATED APPLICATIONS

This application is a national stage filing under 35 U.S.C. 371 of International Patent Application Serial No. PCT/GB2016/053936, filed Dec. 14, 2016, which claims priority to United Kingdom patent application number GB1522147.6, filed Dec. 15, 2015, each of which is incorporated herein by reference in its entirety.

FIELD OF THE INVENTION

The present invention relates to infra-red emitting compositions, solutions and light-emitting devices comprising said light-emitting compositions; and methods of making said light-emitting devices.

BACKGROUND OF THE INVENTION

Electronic devices containing active organic materials include devices such as organic light emitting diodes (OLEDs), organic photoresponsive devices (in particular organic photovoltaic devices and organic photosensors), organic transistors and memory array devices. Devices containing active organic materials can offer benefits such as low weight, low power consumption and flexibility. Moreover, use of soluble organic materials allows use of solution processing in device manufacture, for example inkjet printing or spin-coating.

An OLED includes an anode, a cathode and one or more organic layers between the anode and cathode including at least one organic light-emitting layer.

Holes are injected into the device through the anode and electrons are injected through the cathode during operation of the device. Holes in the highest occupied molecular orbital (HOMO) and electrons in the lowest unoccupied molecular orbital (LUMO) of a light-emitting material combine to form an exciton that releases its energy as light.

A light emitting layer may comprise a semiconducting host material and a light-emitting dopant wherein energy is transferred from the host material to the light-emitting dopant. For example, J. Appl. Phys. 65, 3610, 1989 discloses a host material doped with a fluorescent light-emitting dopant (that is, a light-emitting material in which light is emitted via decay of a singlet exciton).

Phosphorescent dopants are also known (that is, light-emitting dopants in which light is emitted via decay of a triplet exciton).

WO 2008/025997 discloses a composition of a solution processable triazine host material and a phosphorescent moiety.

EP 2287940 discloses a composition comprising a compound represented by Formula (I) or a residue thereof:

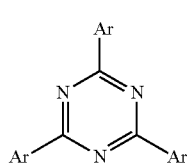

wherein each Ar represents an aryl group optionally having a substituent or a mono-valent heterocyclic group optionally having a substituent.

OLEDs containing red, green and blue light-emitting materials for display and lighting applications are known.

OLEDs containing infrared emitting materials are also known as disclosed in, for example, Chuk-Lam Ho, Hua Li and Wai-Yeung Wong, "Red to near-infrared organometallic phosphorescent dyes for OLED applications", J. Organomet. Chem. 751 (2014), 261-285.

A problem associated with infrared emitting OLEDs is low efficiency.

It is an object of the invention to improve the efficiency of infrared emitting OLEDs.

SUMMARY OF THE INVENTION

In a first aspect the invention provides a composition comprising a light-emitting compound having a peak wavelength of at least 650 nm and a material comprising a group of formula (I):

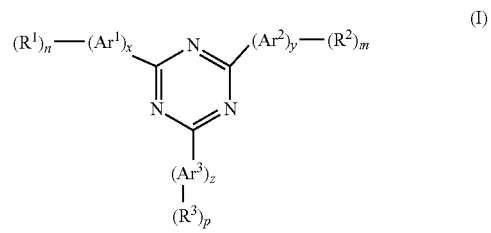

wherein $Ar^1$, $Ar^2$ and $Ar^3$ in each occurrence are independently selected from a $C_{6-20}$ aromatic group and a 6-20 membered heteroaromatic group of C and N ring atoms and at least one of $Ar^1$, $Ar^2$ and $Ar^3$ is a 6-20 membered heteroaromatic group of C and N ring atoms;

x, y and z are each independently at least 1;

n, m and p are each independently 0 or a positive integer;

and $R^1$, $R^2$ and $R^3$ in each occurrence is independently a substituent or a single bond to a polymer chain, wherein the group of formula (I) has no more than 3 single bonds to a polymer chain.

In a second aspect the invention provides a solution comprising a composition according to the first aspect dissolved in one or more solvents.

In a third aspect the invention provides an organic light-emitting device comprising an anode, a cathode and a light-emitting layer between the anode and cathode wherein the light-emitting layer comprises a composition according to the first aspect.

In a fourth aspect the invention provides a method of forming an organic light-emitting device according to claim the third aspect, the method comprising the step of depositing the light-emitting layer over one of the anode and cathode, and depositing the other of the anode and cathode over the light-emitting layer.

DESCRIPTION OF THE DRAWINGS

The invention will now be described in more detail with reference to the Figures, in which.

DETAILED DESCRIPTION OF THE INVENTION

Figure 1:
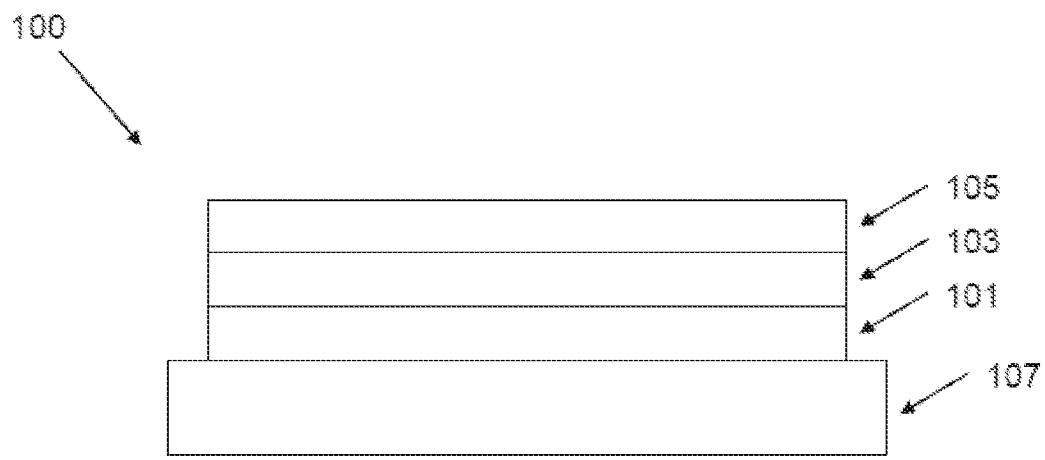
FIG. 1 illustrates an OLED according to an embodiment of the invention.

FIG. 1, which is not drawn to any scale, illustrates schematically an OLED 100 according to an embodiment of the invention. The OLED 100 is carried on substrate 107 and comprises an anode 101, a cathode 105 and a light-emitting layer 103 between the anode and the cathode. Further layers (not shown) may be provided between the anode and the cathode including, without limitation, hole-transporting layers, electron-transporting layers, hole-blocking layers, electron-blocking layers, hole-injection layers and electron-injection layers.

Exemplary OLED structures including one or more further layers include the following:

Anode/Hole-injection layer/Light-emitting layer/Cathode
Anode/Hole transporting layer/Light-emitting layer/Cathode
Anode/Hole-injection layer/Hole-transporting layer/Light-emitting layer/Cathode
Anode/Hole-injection layer/Hole-transporting layer/Light-emitting layer/Electron-transporting layer/Cathode
Anode/Hole-injection layer/Hole-transporting layer/Light-emitting layer/Electron-injecting layer/Cathode Preferably, the device comprises one or both, more preferably both, of a hole-injection layer and a hole-transporting layer.

Preferably, the device comprises at least one of an electron-transporting layer and an electron injection layer.

Light-emitting layer 103 comprises an infrared emitter and a material comprising a group of formula (I):

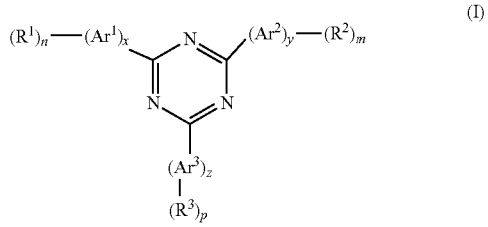

wherein $Ar^1$, $Ar^2$ and $Ar^3$ in each occurrence are independently selected from a $C_{6-20}$ aromatic group and a 6-20 membered heteroaromatic group of C and N ring atoms and at least one of $Ar^1$, $Ar^2$ and $Ar^3$ is a 6-20 membered heteroaromatic group of C and N ring atoms;

x, y and z are each independently at least 1;

n, m and p are each independently 0 or a positive integer;

and $R^1$, $R^2$ and $R^3$ in each occurrence is independently a substituent or a single bond to a polymer chain, wherein the group of formula (I) has no more than 3 single bonds to a polymer chain.

Preferably, light-emitting layer 103 is the only light-emitting layer of the device.

Preferably, at least 90% or 95% of the light emitted by the device when in use, more preferably all light, is light emitted from the infrared emitter.

The infrared emitter has a photoluminescence spectrum with a peak of at least 650 nm, optionally in the range of 650-1000 nm, preferably 700-850 nm. The device containing the infrared emitter preferably emits light having a peak wavelength within one or more of these ranges.

The photoluminescence spectrum of an infrared emitter may be measured by casting 5 wt % of the material in a polystyrene film onto a quartz substrate and measuring in a nitrogen environment using apparatus C9920-02 supplied by Hamamatsu.

The material comprising a group of formula (I) has an excited state energy level that is no more than 0.1 eV lower than, and preferably at least the same as or higher than, the corresponding energy level of the infrared emitter. In the case of a fluorescent infrared emitter, the lowest singlet excited state ($S_1$) energy level of the host material is preferably at least the same as or higher than the $S_1$ energy level of the fluorescent infrared emitter. In the case of a phosphorescent infrared emitter, the lowest triplet excited state ($T_1$) energy level of the host material is preferably at least the same as or higher than the $T_1$ energy level of the phosphorescent infrared emitter.

The singlet excited state energy levels of a host material and a fluorescent compound may be determined from their photofluorescence spectra.

The triplet excited state energy levels of a host material and a phosphorescent compound may be determined from the energy onset of its phosphorescence spectrum measured by low temperature phosphorescence spectroscopy (Y. V. Romaovskii et al, Physical Review Letters, 2000, 85 (5), p 1027, A. van Dijken et al, Journal of the American Chemical Society, 2004, 126, p 7718).

The host material preferably has a lowest unoccupied molecular orbital (LUMO) level of at least 2.5 eV from vacuum level, preferably at least 2.6 or 2.7 eV from vacuum level.

The emitter preferably has a LUMO that is less than 0.4 eV deeper (further from vacuum level) than that of the host.

The host material may be a polymer or a non-polymeric compound. Optionally, a non-polymeric compound as described herein has a molecular weight of no more than about 2,000 or no more than about 1,000 Daltons.

The infrared emitter may be blended with or covalently bound to the host material.

The infrared emitter may be provided in an amount in the range of 0.1-40 wt %, optionally 1-20 wt %, in a composition comprising the host material of formula (I) mixed with the infrared emitter.

In the case where the host material comprising a group of formula (I) is a polymer, the infrared emitter may be provided as a side-group or end group of the polymer backbone or as a repeat unit in the backbone of the polymer. In this case, repeat units comprising an infrared emitter may form 0.1-40 mol % of the repeat units of the polymer. It will therefore be appreciated that the composition of the light-emitting compound and the material comprising a group of formula (I) as described herein may be a single polymeric material or a mixture comprising or consisting of the polymer and the light-emitting compound.

Preferably, $Ar^1$ and $Ar^2$ are each a C6-20 aryl group, optionally phenyl or naphthyl, and $(Ar^3)_z$ comprises or consists of a 6-20 membered heteroaromatic group of C and N ring atoms.

The, or each, 6-20 membered heteroaromatic group of C and N ring atoms of formula (I) is preferably a monocyclic 6 membered heteroaromatic group, optionally pyridine, pyrazine, pyrimidine, pyridazine, 1,2,4-triazine, 1,2,3-triazine or 1,3,5-triazine, preferably pyridine.

Preferably, at least one of $Ar^1$, $Ar^2$ and $Ar^3$ bound directly to the triazine group of formula (I) is a 6-20 membered heteroaromatic group of C and N ring atoms.

Preferably, $(Ar^1)_x$ and $(Ar^2)_y$ are the same.

Optionally, x, y and z are each independently 1, 2 or 3.

Preferably, x is 1.

Preferably, y is 1.

Preferably, z is 1 or 2.

Exemplary groups $(Ar^3)_z$ are:

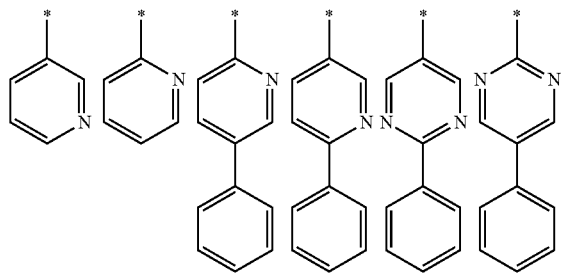

Optionally, $R^1$, $R^2$ and $R^3$ (if present) independently in each occurrence is selected from the group consisting of F; CN; $NO_2$; and $C_{1-20}$ alkyl wherein one or more non-adjacent, non-terminal C atoms of the alkyl group may be replaced with O, S, $NR^2$ or $SiR^2{}_2$, COO or CO wherein $R^2$ in each occurrence is a $C_{1-20}$ hydrocarbyl group, optionally a $C_{1-12}$ alkyl group, unsubstituted phenyl, or phenyl substituted with one or more alkyl groups.

A "non-terminal carbon atom" of an alkyl group as used herein means carbon atoms other than the methyl group of a n-alkyl chain or the methyl groups of a branched alkyl chain.

Optionally, n, m and p are each independently 0, 1, 2, 3 or 4.

Preferably, $(Ar^1)_x$ is not substituted with any substituents $R^1$.

Preferably, $(Ar^2)_y$ is not substituted with any substituents $R^2$.

Preferably, $(Ar^3)_z$ is unsubstituted or is substituted with at least one substituent $R^3$, optionally 1, 2, 3 or 4 substituents $R^3$.

In the case where the host material is a polymer, the group of formula (I) is a repeat unit in the polymer chain, a substituent of a polymeric repeat unit in the polymer chain, or an end group of the polymer chain. Preferably, the group of formula (I) is a repeat unit.

Repeat units of formula (I) may be selected from formulae (Ia)-(Ic)

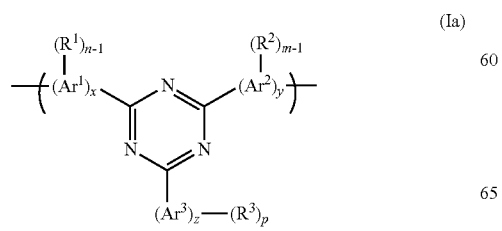
(Ia)

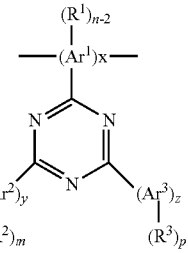
(Ib)

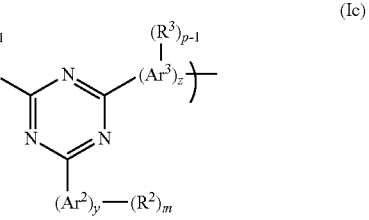
(Ic)

It will be appreciated that n and m of formula (Ia) are each at least 1; n or formula (Ib) is at least 2; and n and p of formula (Ic) are each at least 1.

Exemplary repeat units of formula (I) have the following structures which may be unsubstituted or substituted with one or more substituents, preferably one or more $C_{1-20}$ alkyl groups:

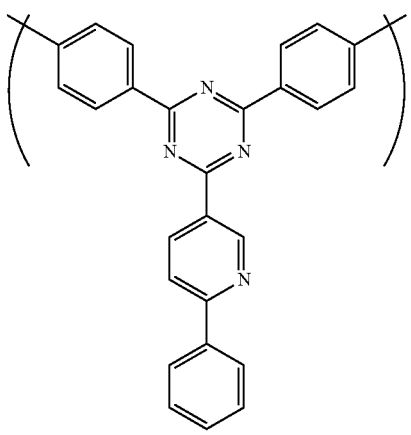

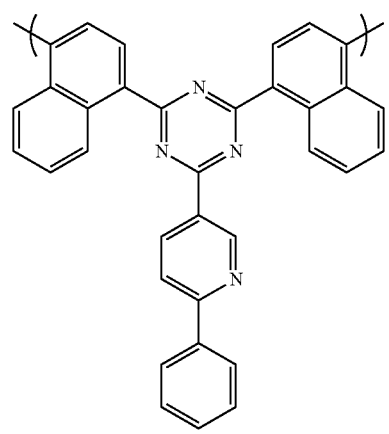

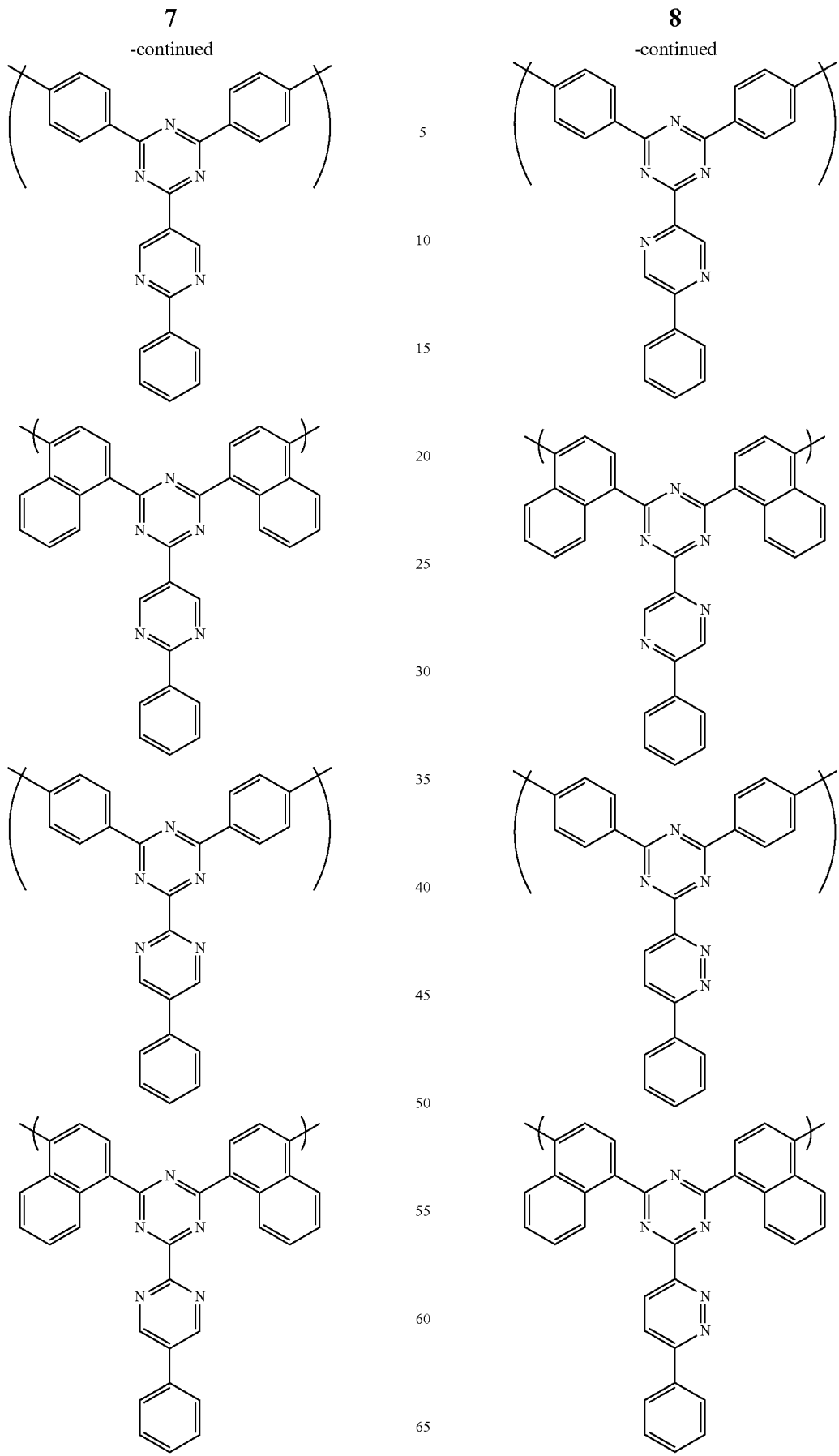

A host polymer comprising a repeat unit of formula (I) is preferably a copolymer comprising a repeat unit of formula (I) and one or more co-repeat units. Repeat units of formula (I) preferably make up 1-50 mol %, optionally 5-50 mol %, of the repeat units of a copolymer.

The host copolymer may comprise $C_{6-20}$ arylene co-repeat units which may be unsubstituted or substituted with one or more substituents.

The host copolymer may comprise arylamine co-repeat units.

Exemplary arylene repeat units are phenylene, fluorene, indenofluorene and phenanthrene repeat units, each of which may be unsubstituted or substituted with one or more substituents. Preferred substituents are selected from $C_{1-40}$ hydrocarbyl groups.

Arylene co-repeat units may be selected from formulae (VII)-(X):

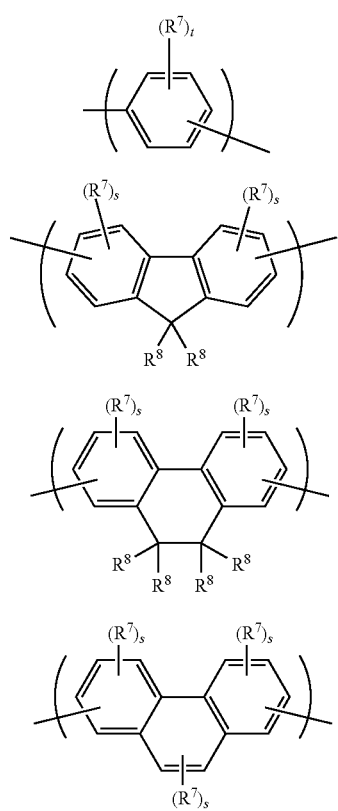

wherein t in each occurrence is independently 0, 1, 2, 3 or 4, preferably 1 or 2; $R^7$ independently in each occurrence is a substituent; s in each occurrence is independently 0, 1 or 2, preferably 0 or 1; and $R^8$ independently in each occurrence is a substituent wherein two $R^8$ groups may be linked to form an unsubstituted or substituted ring.

Where present, each $R^7$ and $R^8$ may independently be selected from the group consisting of:
  alkyl, optionally $C_{1-20}$ alkyl, wherein one or more non-adjacent C atoms may be replaced with optionally substituted aryl or heteroaryl, O, S, substituted N, C=O or —COO—, and one or more H atoms may be replaced with F;
  aryl and heteroaryl groups, preferably $C_{6-20}$ aryl groups, more preferably phenyl, that may be unsubstituted or substituted with one or more substituents; and
  a linear or branched chain of aryl or heteroaryl groups, preferably $C_{6-20}$ aryl groups, more preferably phenyl, each of which groups may independently be substituted, optionally a group of formula —$(Ar^{12})_r$ wherein each $Ar^{12}$ is independently an aryl or heteroaryl group and r is at least 2, preferably a branched or linear chain of phenyl groups.

In the case where $R^7$ or $R^8$ comprises an aryl or heteroaryl group, or a linear or branched chain of aryl or heteroaryl groups, the or each aryl or heteroaryl group may be substituted with one or more substituents $R^8$ selected from the group consisting of:
  alkyl, for example $C_{1-20}$ alkyl, wherein one or more non-adjacent C atoms may be replaced with O, S, substituted N, C=O and —COO— and one or more H atoms of the alkyl group may be replaced with F;
  $NR^9_2$, $OR^9$, $SR^9$, $SiR^9_3$ and
  fluorine, nitro and cyano;
wherein each $R^9$ is independently selected from the group consisting of alkyl, preferably $C_{1-20}$ alkyl; and aryl or heteroaryl, preferably phenyl, optionally substituted with one or more $C_{1-20}$ alkyl groups.

Substituted N, where present, may be —$NR^{10}$— wherein $R^{10}$ is a substituent and is optionally a $C_{1-40}$ hydrocarbyl group, optionally a $C_{1-20}$ alkyl group.

Preferred substituents of aryl or heteroaryl groups of $R^7$ or $R^8$ are selected from $C_{1-20}$ alkyl.

In the case where two groups $R^8$ form a ring, the one or more substituents of the ring, if present, are optionally selected from $C_{1-20}$ alkyl groups.

Preferably, each $R^7$, where present, and $R^8$ is independently selected from $C_{1-40}$ hydrocarbyl. Preferred $C_{1-40}$ hydrocarbyl groups are $C_{1-20}$ alkyl; unsubstituted phenyl; phenyl substituted with one or more $C_{1-20}$ alkyl groups; and a linear or branched chain of phenyl groups, wherein each phenyl may be unsubstituted or substituted with one or more $C_{1-20}$ alkyl groups.

Arylene repeat units may form 1-99 mol %, preferably 10-95 mol % of the repeat units of a host polymer.

The host polymer may comprise arylamine co-repeat units of formula (VI):

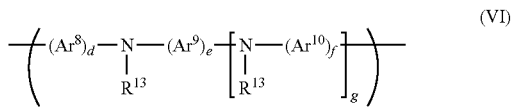

wherein $Ar^8$, $Ar^9$ and $Ar^{10}$ in each occurrence are independently selected from substituted or unsubstituted aryl or heteroaryl, g is 0, 1 or 2, preferably 0 or 1, $R^{13}$ independently in each occurrence is a substituent, and d, e and f are each independently 1, 2 or 3.

$R^{13}$, which may be the same or different in each occurrence when g is 1 or 2, is preferably selected from the group consisting of alkyl, optionally $C_{1-20}$ alkyl, $Ar^{11}$ and a branched or linear chain of $Ar^{11}$ groups wherein $Ar^{11}$ in each occurrence is independently substituted or unsubstituted aryl or heteroaryl.

Any two aromatic or heteroaromatic groups selected from $Ar^8$, $Ar^9$, and, if present, $Ar^{10}$ and $Ar^{11}$ that are directly bound to the same N atom may be linked by a direct bond or a divalent linking atom or group. Preferred divalent linking atoms and groups include O, S; substituted N; and substituted C.

Ar$^8$ and Ar$^{10}$ are preferably C$_{6-20}$ aryl, more preferably phenyl, that may be unsubstituted or substituted with one or more substituents.

In the case where g=0, Ar$^9$ is preferably C$_{6-20}$ aryl, more preferably phenyl, that may be unsubstituted or substituted with one or more substituents.

In the case where g=1, Ar$^9$ is preferably C$_{6-20}$ aryl, more preferably phenyl or a polycyclic aromatic group, for example naphthalene, perylene, anthracene or fluorene, that may be unsubstituted or substituted with one or more substituents.

R$^{13}$ is preferably Ar$^{11}$ or a branched or linear chain of Ar$^{11}$ groups. Ar$^{11}$ in each occurrence is preferably phenyl that may be unsubstituted or substituted with one or more substituents.

Exemplary groups R$^{13}$ include the following, each of which may be unsubstituted or substituted with one or more substituents, and wherein * represents a point of attachment to N:

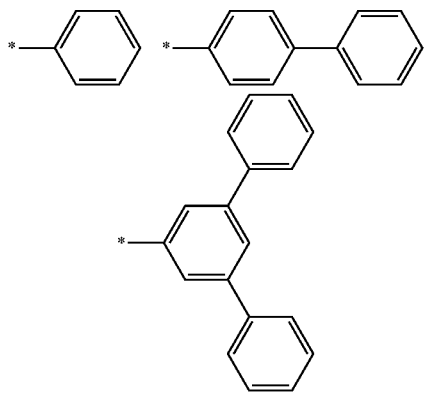

d e and f are preferably each 1.

Ar$^8$, Ar$^9$, and, if present, Ar$^{10}$ and Ar$^{11}$ are each independently unsubstituted or substituted with one or more, optionally 1, 2, 3 or 4, substituents. Exemplary substituents may be selected from substituted or unsubstituted alkyl, optionally C$_{1-20}$ alkyl, wherein one or more non-adjacent C atoms may be replaced with optionally substituted aryl or heteroaryl (preferably phenyl), O, S, C=O or —COO— and one or more H atoms may be replaced with F.

Preferred substituents of Ar$^8$, Ar$^9$, and, if present, Ar$^{10}$ and Ar$^{11}$ are C$_{1-40}$ hydrocarbyl, preferably C$_{1-20}$ alkyl.

Preferred repeat units of formula (VI) include unsubstituted or substituted units of formulae (VI-1), (VI-2) and (VI-3):

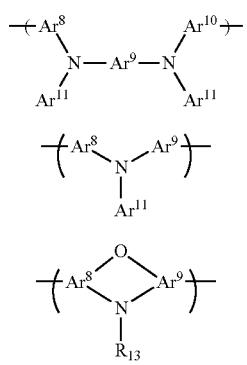

The host copolymer may comprise or consist of repeat units of formula (I), optionally (Ia), (Ib) or (Ic), and one or more repeat units selected from arylamine repeat units, optionally repeat units of formula (VI), and arylene repeat units as described herein, optionally one or more arylene repeat units of formulae (VII)-(X).

Polymers as described herein including, without limitation, host polymers, may have a polystyrene-equivalent number-average molecular weight (Mn) measured by gel permeation chromatography in the range of about 3×10$^3$ to 1×10$^8$, and preferably 1×10$^3$ to 5×10$^6$. The polystyrene-equivalent weight-average molecular weight (Mw) of the polymers described herein may be 1×10$^3$ to 1×10$^8$, and preferably 1×10$^4$ to 1×10$^7$.

Polymers as described herein including, without limitation, host polymers, are preferably amorphous.

Infrared Emitters

The infrared emitter as described herein may be a fluorescent or phosphorescent infrared emitter, preferably a phosphorescent emitter.

The infrared emitter is preferably a phosphorescent metal complex, optionally a complex of Ruthenium, Rhodium, Palladium, Silver, Tungsten, Rhenium, Osmium, Iridium, Platinum or Gold, preferably Ir$^{3+}$. The phosphorescent metal complex preferably comprises at least one C,N-cyclometallating bidentate ligand.

The infrared emitter may have formula (II):

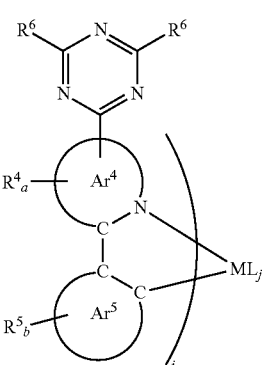

(II)

wherein:

M is a transition metal;

Ar$^4$ is a 5 or 6 membered heteroaryl ring or a polycyclic heteroaromatic group;

Ar$^5$ is a polycyclic group comprising two or more rings selected from aromatic and heteroaromatic rings;

Ar$^4$ and Ar$^5$ may be linked by a direct bond or divalent linking group;

L is a ligand;

i is at least 1;

j is 0 or a positive integer;

a is 0 or a positive integer;

b is 0 or a positive integer;

R$^4$, R$^5$ and R$^6$ are each independently a substituent; and (i) Ar$^4$ is a polycyclic heteroaromatic group; or (ii) Ar$^4$ is a 5 or 6 membered heteroaryl ring and Ar$^5$ is a polycyclic group comprising at least 3 rings selected from aromatic and heteroaromatic rings.

Metal M of the phosphorescent compound of formula (II) may be any suitable transition metal, for example a transition metal of the second or third row of the d-block elements (Period 5 and Period 6, respectively, of the Periodic Table).

Exemplary metals include Ruthenium, Rhodium, Palladium, Silver, Tungsten, Rhenium, Osmium, Iridium, Platinum and Gold. Preferably, M is iridium.

The compound of formula (II) may contain one or more ligands L other than ligands of formula:

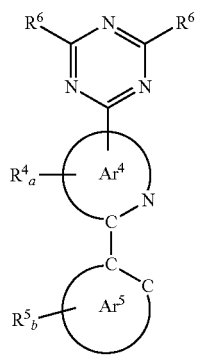

Ligand L, if present, may be a monodentate or polydentate ligand. Optionally, L is a bidentate ligand. Optionally, L is selected from O,O cyclometallating ligands; N,O cyclometallating ligands, optionally picolinate; and N,N cyclometallating ligands.

L may be a ligand of formula:

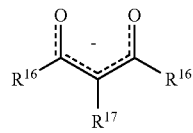

wherein $R^{16}$ in each occurrence is independently a substituent, preferably $C_{1-10}$ alkyl and $R^{17}$ is H or a substituent, preferably H or $C_{1-10}$ alkyl; and wherein one $R^{16}$ and $R^{17}$ may be linked to form a ring, optionally a 6-10 membered aromatic or heteroaromatic ring that may be unsubstituted or substituted with one or more substituents, optionally one or more substituents selected from $C_{1-20}$ hydrocarbyl groups.

Preferably $R^{16}$ is $C_{1-4}$ alkyl, more preferably methyl or tert-butyl.

Preferably, j is 0 or 1.

The compound of formula (II) comprises at least one ligand of formula:

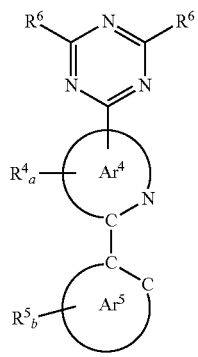

In case (i) $Ar^4$ is a polycyclic heteroaromatic group and $Ar^5$ is a polycyclic group comprising at least 2 rings selected from aromatic and heteroaromatic rings.

By "polycyclic heteroaromatic group" as used herein is meant a polycyclic group comprising a heteroaromatic ring and further comprising one or more rings selected from aromatic and heteroaromatic rings. The rings of the polycyclic heteroaromatic group may consist of fused heteroaromatic or aromatic rings or may comprise one or more non-aromatic rings. Preferably, all aromatic or heteroaromatic rings of the polycyclic heteroaromatic group are conjugated to each other directly or through one or more intervening aromatic or heteroaromatic rings.

In case (ii) $Ar^4$ is a monocyclic 5 or 6 membered heteroaryl ring and $Ar^5$ is a polycyclic group comprising at least 3 rings selected from aromatic and heteroaromatic rings.

The polycyclic group $Ar^5$ may consist of fused heteroaromatic or aromatic rings or may comprise one or more non-aromatic rings. Preferably, all aromatic or heteroaromatic rings of the polycyclic group $Ar^5$ are conjugated to each other directly or through one or more intervening aromatic or heteroaromatic rings.

A polycyclic group $Ar^4$ or $Ar^5$ may be a 10-30 membered polycyclic group.

In case (i), $Ar^4$ is optionally a 10-membered polycyclic heteroaromatic of C and N atoms, optionally a polycyclic heteroaromatic of pyridine or pyrazine fused to any of benzene, pyridine or pyrazine. $Ar^4$ is preferably selected from quinoline or isoquinoline. Optionally, the ligand $Ar^4$-$Ar^5$ is selected from the following ligands wherein the quinoline or isoquinoline group is substituted with a triazine group as illustrated in Formula (II) and optionally with one or more substituents $R^4$ and wherein $Ar^5$ is unsubstituted or substituted with one or more substituents $R^5$:

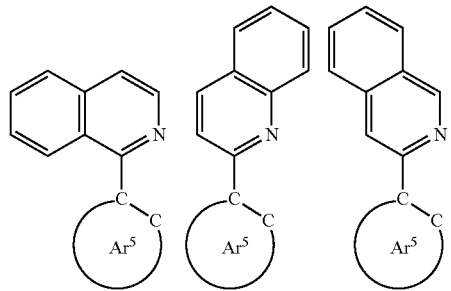

In case (i), optionally $Ar^2$ is selected such that ligand $Ar^1$-$Ar^2$ is selected from the following ligands wherein $Ar^1$ may be substituted with one or more substituents $R^1$ and wherein $Ar^2$ is unsubstituted or substituted with one or more substituents $R^2$:

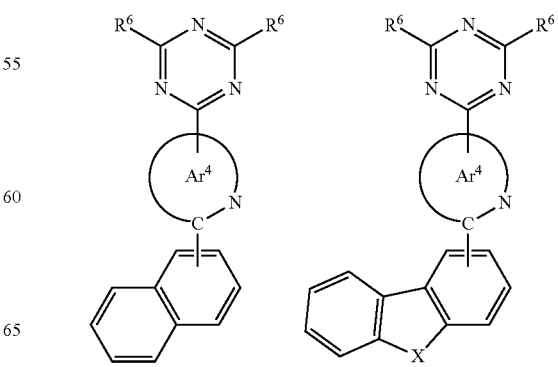

-continued

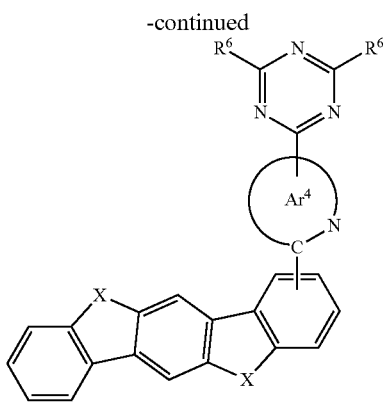

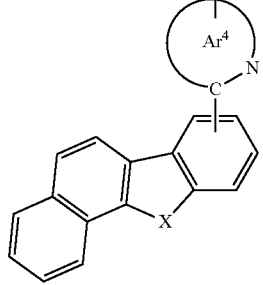

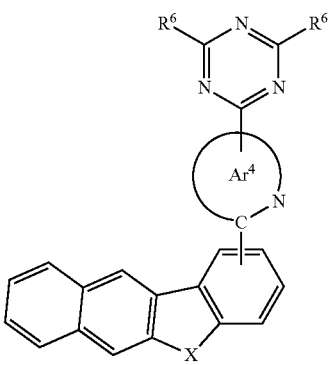

wherein X in each occurrence is independently $CR^2_2$, $SiR^2_2$, $NR^2$, O or S wherein $R^2$ independently in each occurrence is a substituent.

In case (ii), $Ar^4$ is a monocyclic 5 or 6 membered heteroaromatic ring, preferably a 6-membered heteroaromatic ring of C and N atoms, preferably pyridine, and $Ar^5$ is preferably a polyaromatic group, optionally a $C_{10-20}$ polyaromatic compound. Preferably, $Ar^5$ of case (ii) is a polyaromatic hydrocarbon of 3 or more fused benzene rings, preferably phenanthrene, that may be unsubstituted or substituted with one or more substituents $R^2$.

In either case (i) or (ii) there may be a direct bond or divalent linking group between $Ar^4$ and $Ar^5$ (in addition to the C—C bond shown in Formula (II) between $Ar^4$ and $Ar^5$).

$R^4$ and $R^5$, if present, may independently in each occurrence be selected from the group consisting of:

$C_{1-20}$ alkyl wherein one or more non-adjacent C atoms of the $C_{1-20}$ alkyl may be replaced with —O—, —S—, C═O or —COO— and one or more H atoms may be replaced with F; and a group of formula —$(Ar^7)p$ wherein $Ar^7$ in each occurrence is a $C_{6-20}$ aryl group or a 5-20 membered heteroaryl group that may be unsubstituted or substituted with one or more substituents; and p is at least 1, optionally 1, 2 or 3.

Substituents of $Ar^7$, if present, are optionally selected from the group consisting of F, CN, $NO_2$ and $C_{1-20}$ alkyl wherein one or more non-adjacent C atoms of the $C_{1-20}$ alkyl may be replaced with —O—, —S—, C═O or —COO— and one or more H atoms may be replaced with F. If present, the one or more substituents of $Ar^7$ are preferably selected from $C_{1-20}$ alkyl.

Optionally, $R^6$ in each occurrence is independently selected from the group consisting of:

$C_{1-20}$ alkyl wherein one or more non-adjacent C atoms of the $C_{1-20}$ alkyl may be replaced with —O—, —S—, C═O or —COO— and one or more H atoms may be replaced with F; and a group of formula —$(Ar^8)q$ wherein $Ar^8$ in each occurrence is a $C_{6-20}$ aryl group or a 5-20 membered heteroaryl group that may be unsubstituted or substituted with one or more substituents; and q is at least 1.

Substituents of $Ar^8$, if present, are optionally selected from the group consisting of F, CN, $NO_2$ and $C_{1-20}$ alkyl wherein one or more non-adjacent C atoms of the $C_{1-20}$ alkyl may be replaced with —O—, —S—, C═O or —COO— and one or more H atoms may be replaced with F. If present, the one or more substituents of Ar8 are preferably selected from $C_{1-20}$ alkyl.

Preferably, $R^6$ is phenyl that may be unsubstituted or substituted with one or more substituents.

The triazine substituent of formula (II) may be bound to any available position of $Ar^4$, preferably an aromatic carbon atom of $Ar^4$. Preferably, the triazine substituent is bound to an atom meta-to the N atom of $Ar^4$ that is bound to M.

Exemplary compounds of formula (II) according to case (i) include the following:
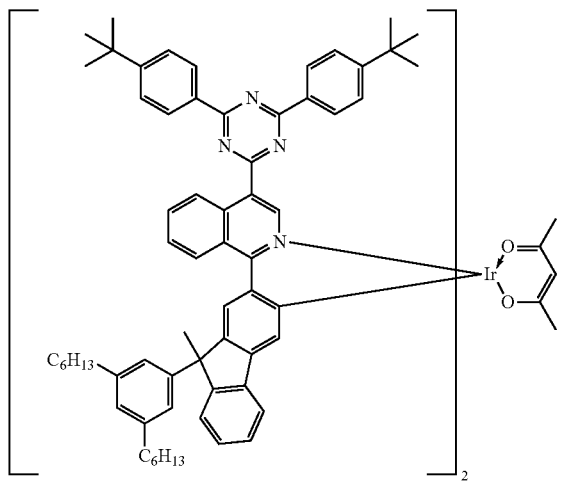
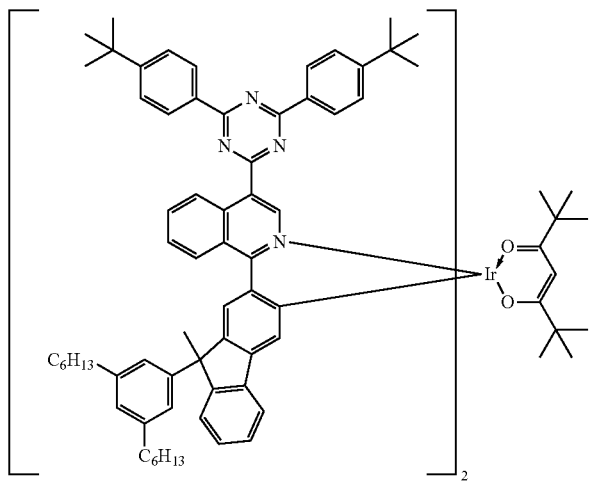
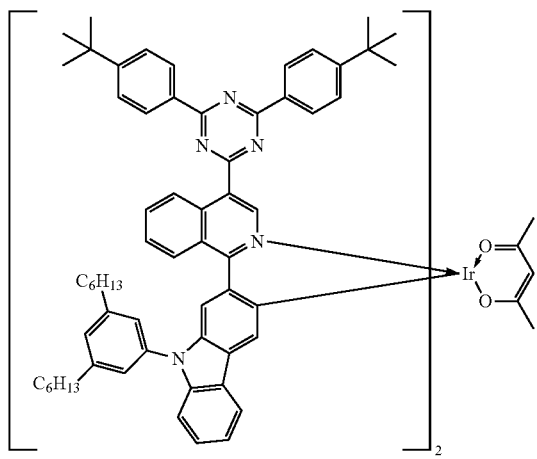
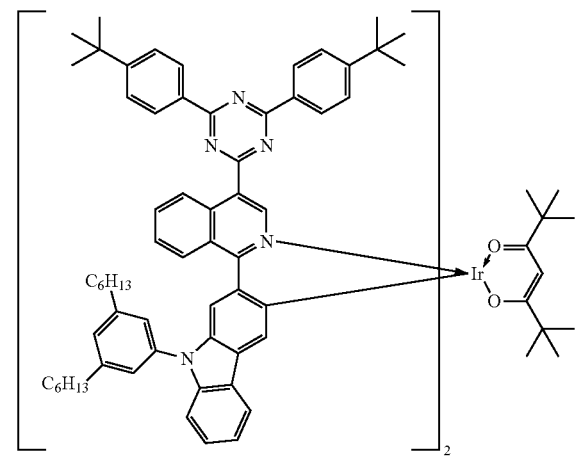

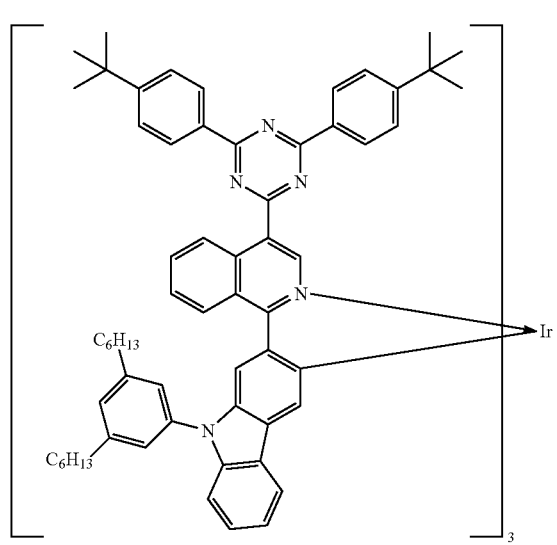
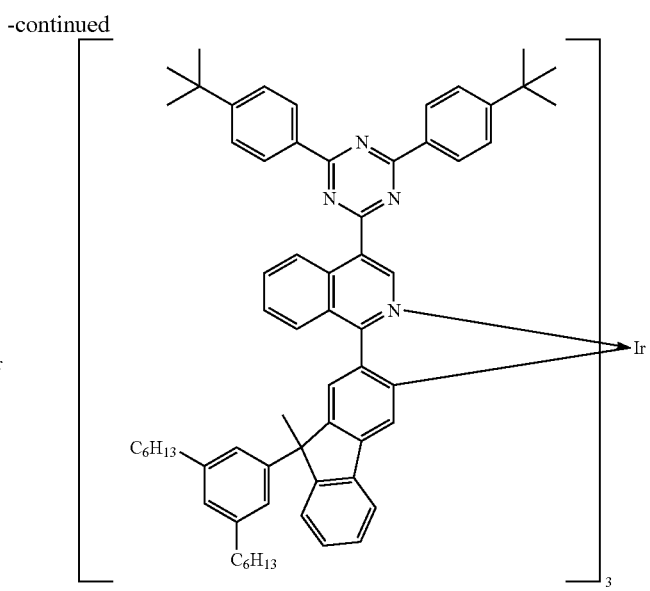
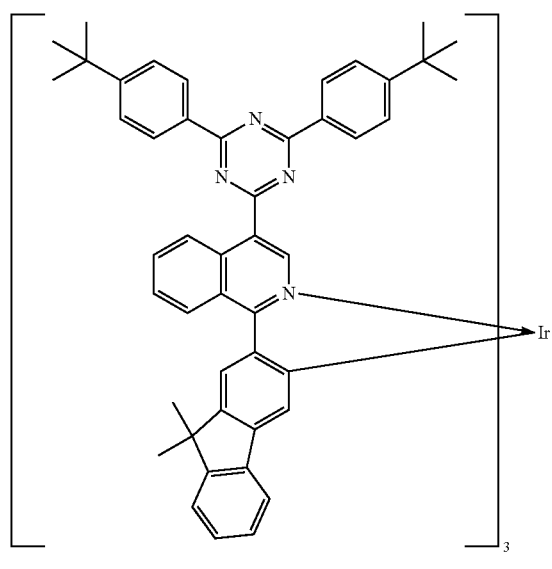
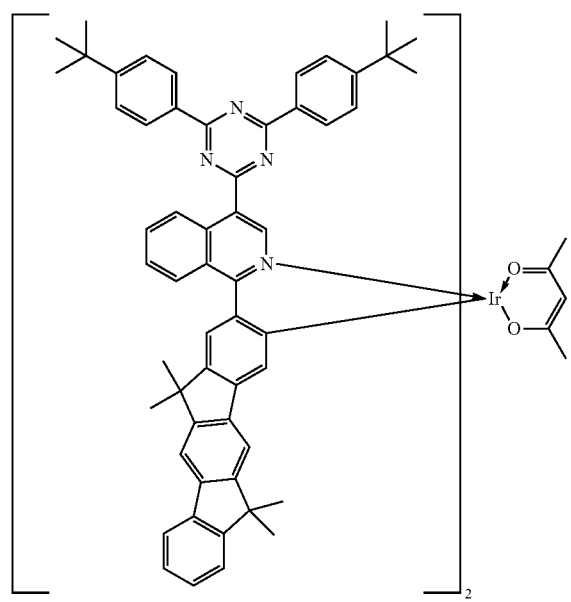

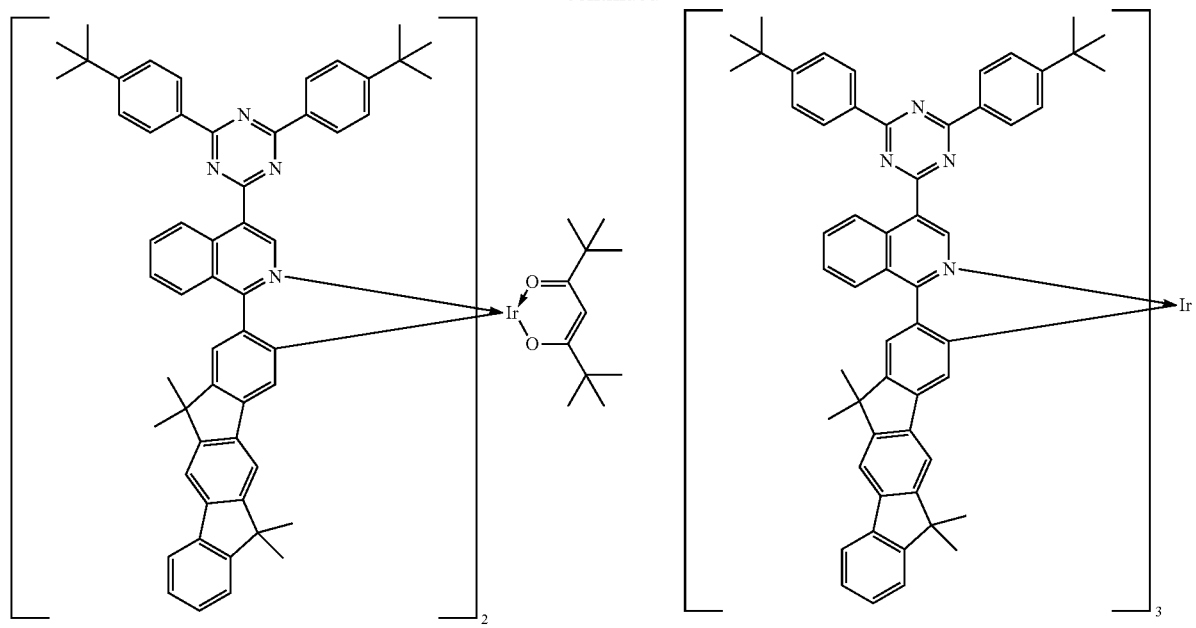
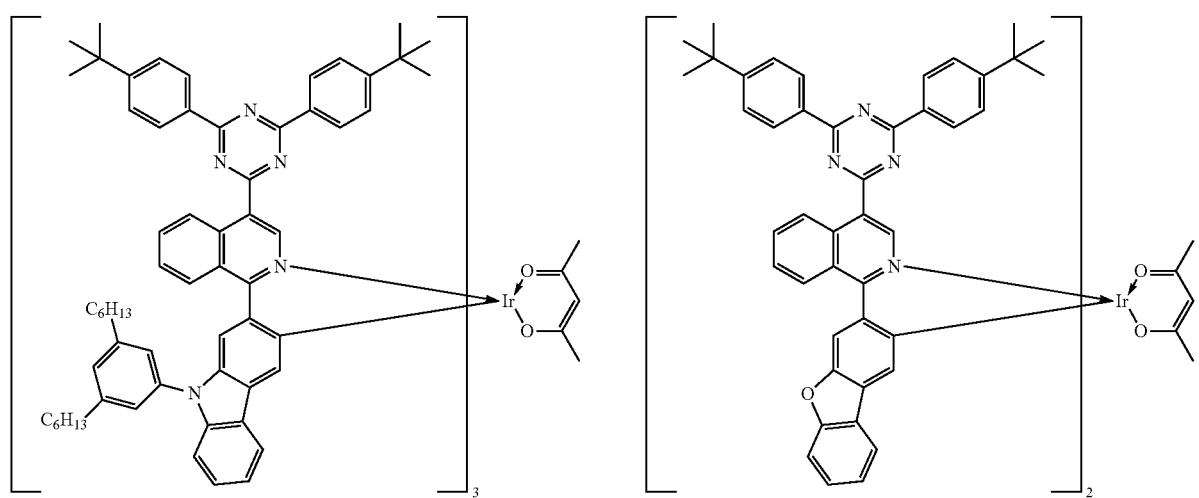

-continued
23
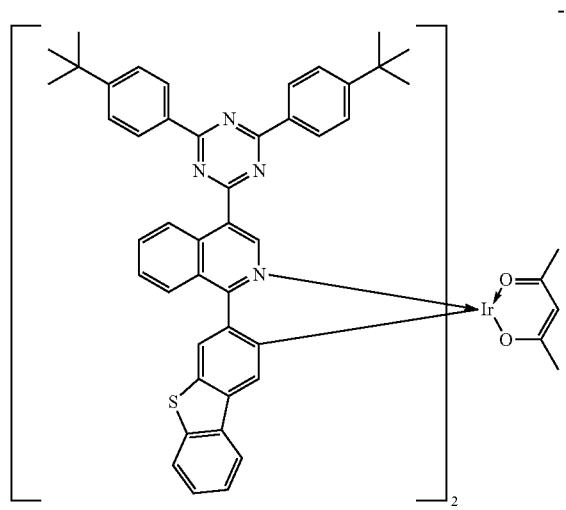
24
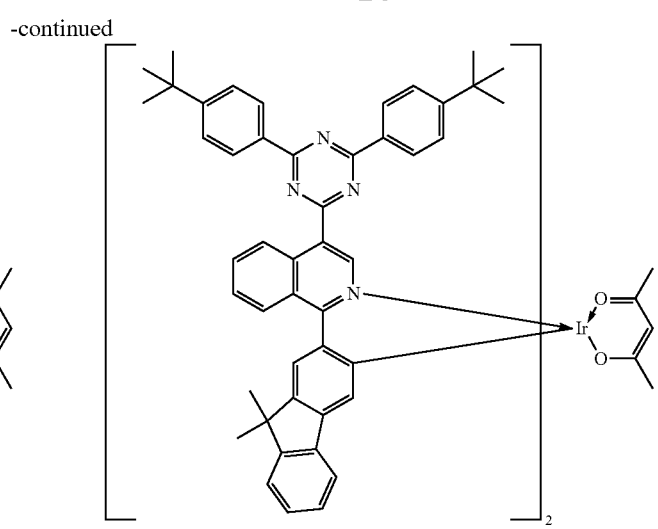
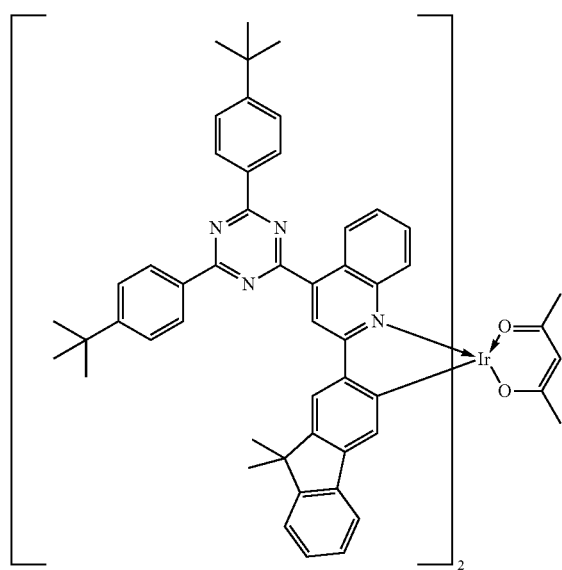
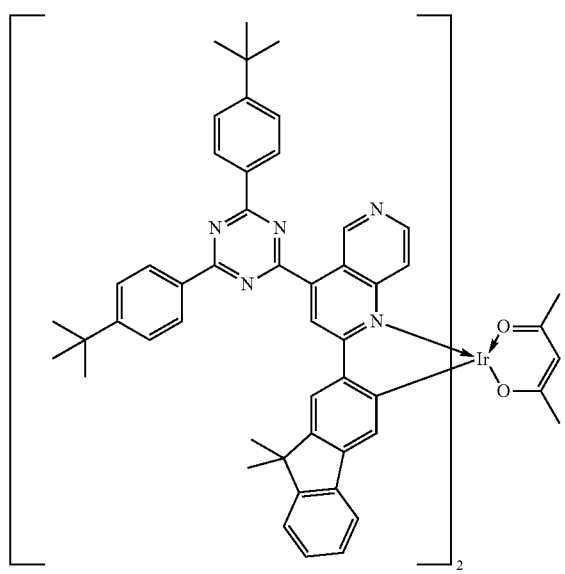

25
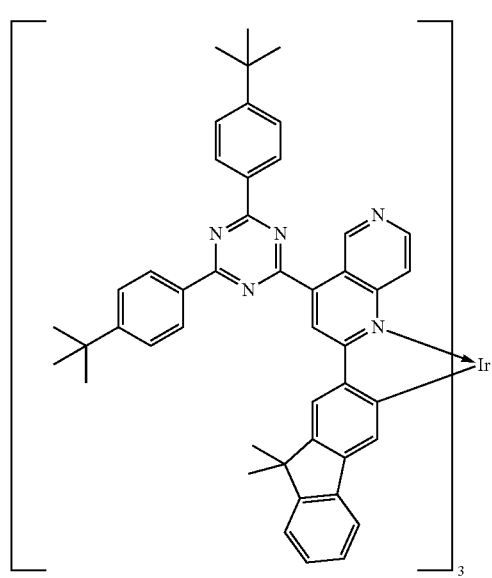
26
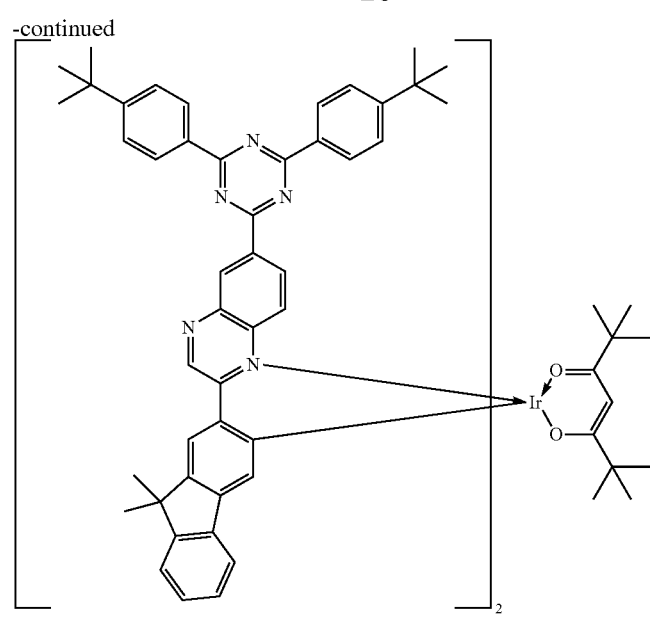
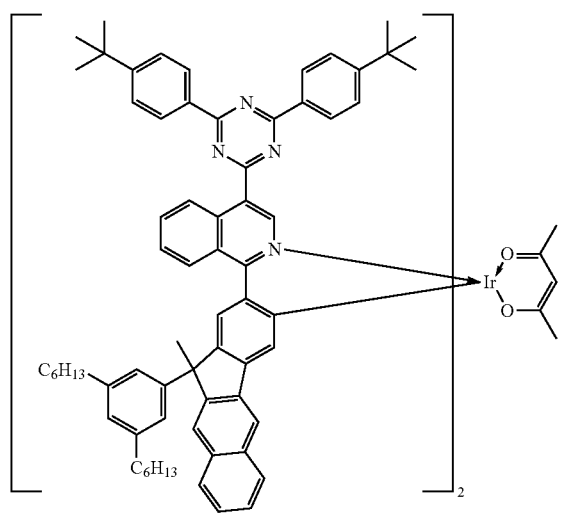
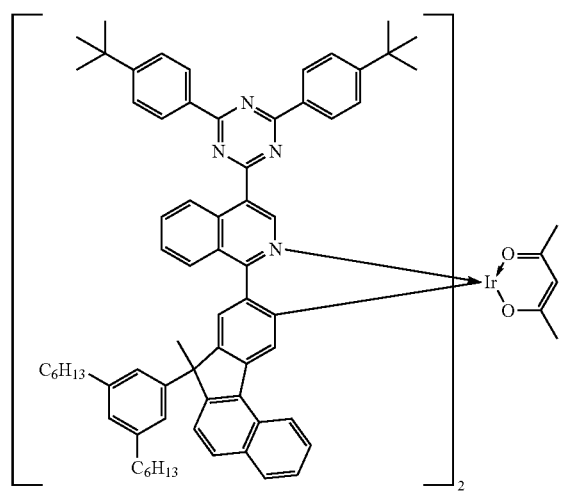

-continued
27
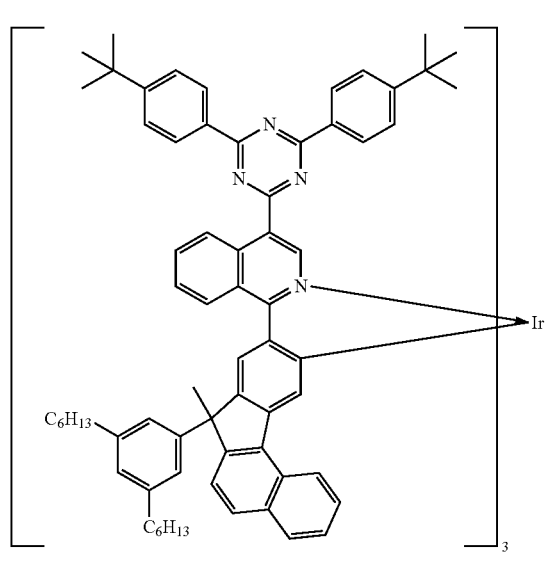
28
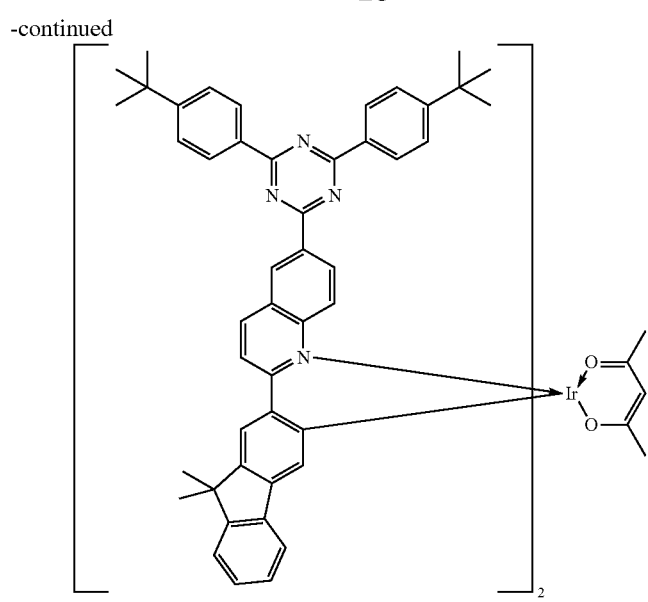
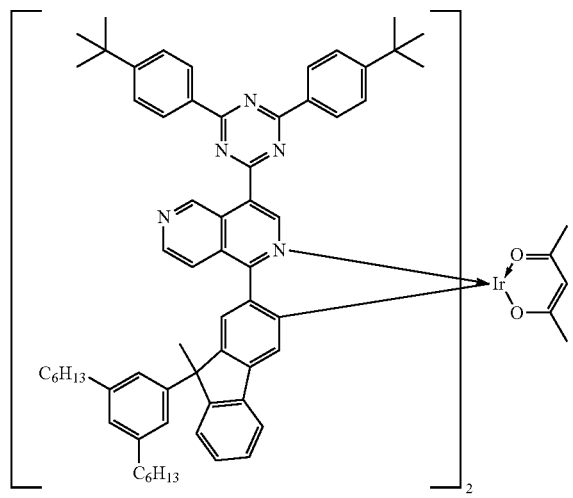
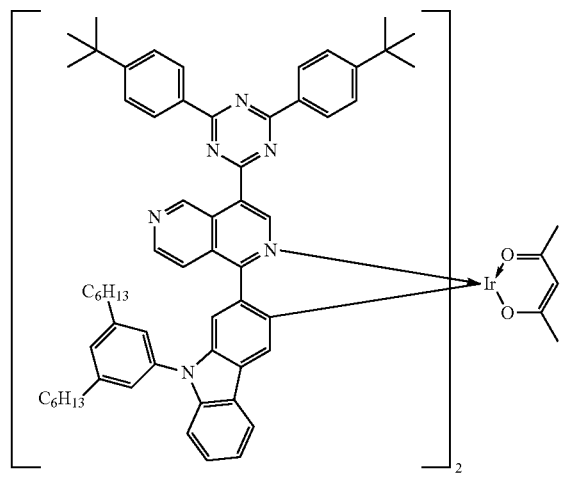

-continued
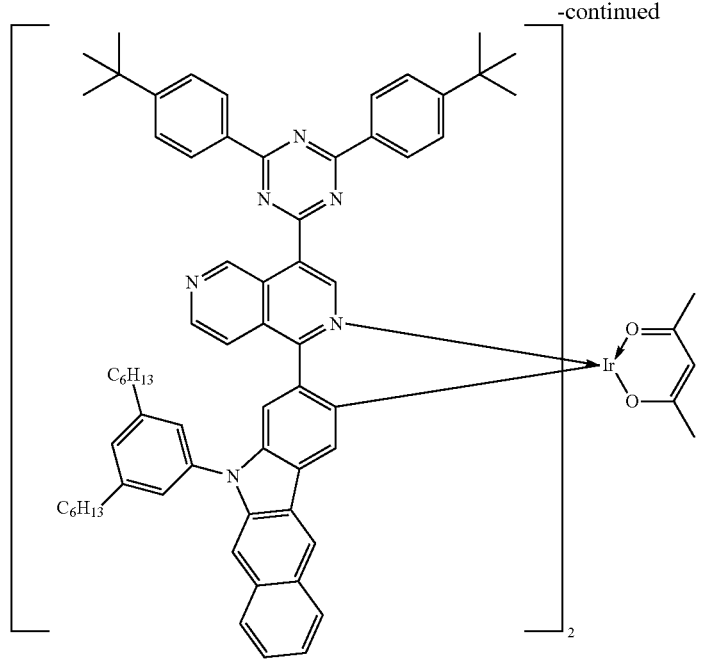
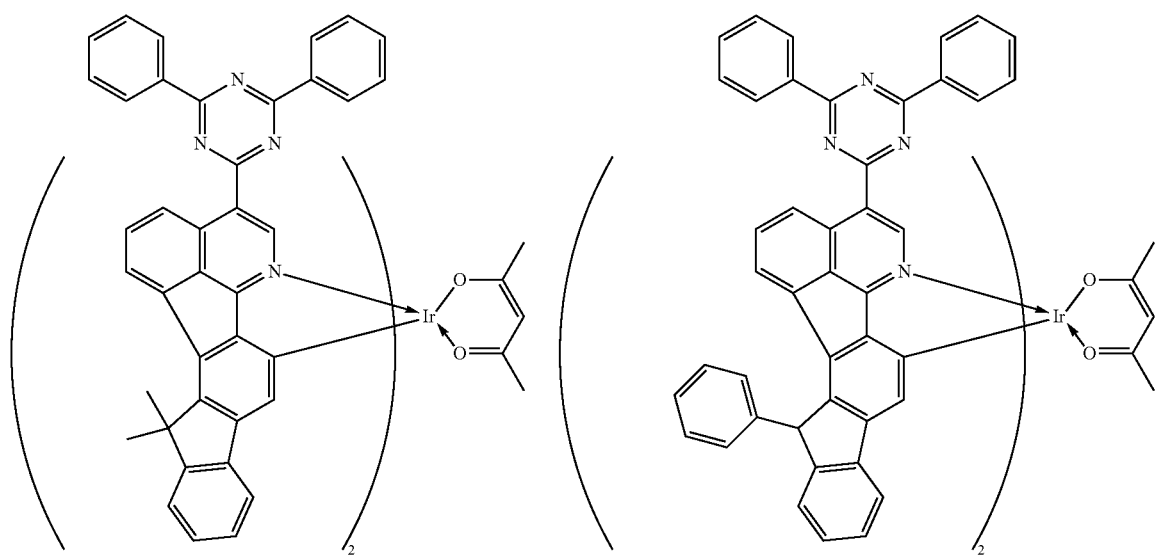

Exemplary compounds of formula (II) according to case (ii) include the following:

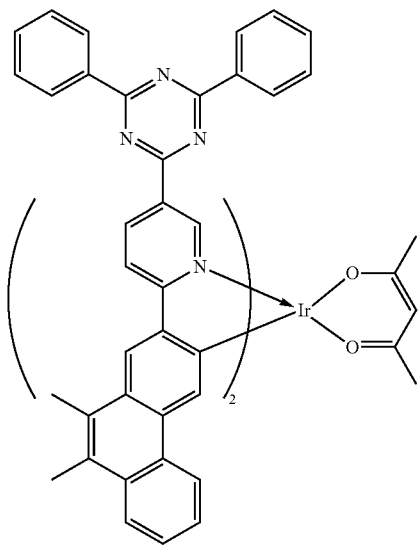

Charge Transporting and Charge Blocking Layers

A hole transporting layer may be provided between the anode of an OLED and a light-emitting layer comprising the composition as described herein.

An electron transporting layer may be provided between the cathode of an OLED and a light-emitting layer comprising the composition as described herein.

An electron blocking layer may be provided between the anode and the light-emitting layer.

A hole blocking layer may be provided between the cathode and the light-emitting layer.

Transporting and blocking layers may be used in combination. Depending on its HOMO and LUMO levels, a single layer may both transport one of holes and electrons and block the other of holes and electrons.

A charge-transporting layer or charge-blocking layer may be crosslinked, particularly if a layer overlying that charge-transporting or charge-blocking layer is deposited from a solution. The crosslinkable group used for this crosslinking may be a crosslinkable group comprising a reactive double bond such and a vinyl or acrylate group, or a benzocyclobutane group. The crosslinkable group may be provided as a substituent pendant from the backbone of a charge-transporting or charge-blocking polymer. Following formation of a charge-transporting or charge blocking layer, the crosslinkable group may be crosslinked by thermal treatment or irradiation.

If present, a hole transporting layer located between the anode and the light-emitting layer preferably contains a hole-transporting material having a HOMO level of less than or equal to 5.5 eV, more preferably around 4.8-5.5 eV as measured by cyclic voltammetry. The HOMO level of the hole transporting material of the hole-transporting layer may be selected so as to be within 0.2 eV, optionally within 0.1 eV, of the HOMO of a component of the hole-transporting layer, optionally the infrared emitter or the material comprising a group of formula (I), in order to provide a small barrier to hole transport.

A hole-transporting material of a hole-transporting polymer may be a polymer comprising a repeat unit of formula (VI) as described herein, optionally a homopolymer of a repeat unit of formula (VI) or a copolymer comprising a repeat unit of formula (VI) and one or more co-repeat units, optionally one or more arylene co-repeat units as described herein. One or more repeat units of such a hole-transporting polymer may be substituted with a crosslinkable group, optionally a crosslinkable double bond group and/or a crosslinkable benzocyclobutane group, that may be crosslinked following deposition of the hole-transporting polymer to form the hole-transporting layer.

If present, an electron transporting layer located between the light-emitting layers and cathode preferably has a LUMO level of around 2.5-3.5 eV as measured by square wave cyclic voltammetry. A layer of a silicon monoxide or silicon dioxide or other thin dielectric layer having thickness in the range of 0.2-2 nm may be provided between the light-emitting layer nearest the cathode and the cathode.

An electron transporting layer may contain a polymer comprising a chain of optionally substituted arylene repeat units, such as a chain of fluorene repeat units.

HOMO and LUMO levels as described herein may be measured by cyclic voltammetry (CV) as follows.

The working electrode potential is ramped linearly versus time. When cyclic voltammetry reaches a set potential the working electrode's potential ramp is inverted. This inversion can happen multiple times during a single experiment. The current at the working electrode is plotted versus the applied voltage to give the cyclic voltammogram trace.

Apparatus to measure HOMO or LUMO energy levels by CV may comprise a cell containing a tert-butyl ammonium perchlorate/ or tertbutyl ammonium hexafluorophosphate solution in acetonitrile, a glassy carbon working electrode where the sample is coated as a film, a platinium counter electrode (donor or acceptor of electrons) and a reference glass electrode no leak Ag/AgCl. Ferrocene is added in the cell at the end of the experiment for calculation purposes. (Measurement of the difference of potential between Ag/AgCl/ferrocene and sample/ferrocene).

Method and Settings:
3 mm diameter glassy carbon working electrode
Ag/AgCl/no leak reference electrode
Pt wire auxiliary electrode
0.1 M tetrabutylammonium hexafluorophosphate in acetonitrile
LUMO=4.8-ferrocene (peak to peak maximum average)+ onset
Sample: 1 drop of 5 mg/mL in toluene spun @3000 rpm
LUMO (reduction) measurement:

A good reversible reduction event is typically observed for thick films measured at 200 mV/s and a switching potential of −2.5V. The reduction events should be measured and compared over 10 cycles, usually measurements are taken on the $3^{rd}$ cycle. The onset is taken at the intersection of lines of best fit at the steepest part of the reduction event and the baseline.

Hole Injection Layers

A conductive hole injection layer, which may be formed from a conductive organic or inorganic material, may be provided between the anode and the light-emitting layer or layers to assist hole injection from the anode into the layer or layers of semiconducting polymer. A hole transporting layer may be used in combination with a hole injection layer.

Examples of doped organic hole injection materials include optionally substituted, doped poly(ethylene dioxythiophene) (PEDT), in particular PEDT doped with a charge-balancing polyacid such as polystyrene sulfonate (PSS) as disclosed in EP 0901176 and EP 0947123, polyacrylic acid or a fluorinated sulfonic acid, for example Nafion®; polyaniline as disclosed in U.S. Pat. Nos. 5,723, 873 and 5,798,170; and optionally substituted polythiophene or poly(thienothiophene). Examples of conductive inorganic materials include transition metal oxides such as VOx, MoOx and RuOx as disclosed in Journal of Physics D: Applied Physics (1996), 29(11), 2750-2753.

Cathode

The cathode is selected from materials that have a work function allowing injection of electrons into the light-emitting layer or layers. Other factors influence the selection of the cathode such as the possibility of adverse interactions between the cathode and the light-emitting materials. The cathode may consist of a single material such as a layer of aluminium. Alternatively, it may comprise a plurality of metals, for example a bilayer of a low work function material and a high work function material such as calcium and aluminium as disclosed in WO 98/10621. The cathode may contain a layer containing elemental barium, for example as disclosed in WO 98/57381, Appl. Phys. Lett. 2002, 81(4), 634 and WO 02/84759 or a layer containing elemental magnesium. The cathode may contain a thin (e.g. 1-5 nm thick) layer of metal compound between the light-emitting layer(s) of the OLED and one or more conductive layers of the cathode, such as one or more metal layers. Exemplary metal compounds include an oxide or fluoride of an alkali or alkali earth metal, to assist electron injection, for example lithium fluoride as disclosed in WO 00/48258; barium fluoride as disclosed in Appl. Phys. Lett. 2001, 79(5), 2001; and barium oxide. In order to provide efficient injection of electrons into the device, the cathode preferably has a work function of less than 3.5 eV, more preferably less than 3.2 eV, most preferably less than 3 eV. Work functions of metals can be found in, for example, Michaelson, J. Appl. Phys. 48(11), 4729, 1977.

The cathode may be opaque or transparent. Transparent cathodes are particularly advantageous for active matrix devices because emission through a transparent anode in such devices is at least partially blocked by drive circuitry located underneath the emissive pixels. A transparent cathode comprises a layer of an electron injecting material that is sufficiently thin to be transparent. Typically, the lateral conductivity of this layer will be low as a result of its thinness. In this case, the layer of electron injecting material is used in combination with a thicker layer of transparent conducting material such as indium tin oxide.

It will be appreciated that a transparent cathode device need not have a transparent anode (unless, of course, a fully transparent device is desired), and so the transparent anode used for bottom-emitting devices may be replaced or supplemented with a layer of reflective material such as a layer of aluminium. Examples of transparent cathode devices are disclosed in, for example, GB 2348316.

Encapsulation

Organic optoelectronic devices tend to be sensitive to moisture and oxygen. Accordingly, the substrate 101 preferably has good barrier properties for prevention of ingress of moisture and oxygen into the device. The substrate is commonly glass, however alternative substrates may be used, in particular where flexibility of the device is desirable. For example, the substrate may comprise a plastic as in U.S. Pat. No. 6,268,695 which discloses a substrate of alternating plastic and barrier layers or a laminate of thin glass and plastic as disclosed in EP 0949850.

The device may be encapsulated with an encapsulant (not shown) to prevent ingress of moisture and oxygen. Suitable encapsulants include a sheet of glass, films having suitable barrier properties such as silicon dioxide, silicon monoxide, silicon nitride or alternating stacks of polymer and dielectric as disclosed in, for example, WO 01/81649 or an airtight container as disclosed in, for example, WO 01/19142. In the case of a transparent cathode device, a transparent encapsulating layer such as silicon monoxide or silicon dioxide may be deposited to micron levels of thickness, although in one preferred embodiment the thickness of such a layer is in the range of 20-300 nm. A getter material for absorption of any atmospheric moisture and/or oxygen that may permeate through the substrate or encapsulant may be disposed between the substrate and the encapsulant.

Solution Processing

Suitable solvents for forming solution processable formulations of the comprising the composition as described herein may be selected from organic solvents, preferably mono- or poly-alkylbenzenes such as toluene and xylene and mono- or poly-alkoxybenzenes, and mixtures thereof.

Exemplary solution deposition techniques for forming a light-emitting layer comprising the composition as described herein include printing and coating techniques such spin-coating, dip-coating, roll-to-roll coating or roll-to-roll printing, doctor blade coating, slot die coating, gravure printing, screen printing and inkjet printing.

Coating methods, such as those described above, are particularly suitable for devices wherein patterning of the light-emitting layer or layers is unnecessary—for example for lighting applications or simple monochrome segmented displays.

Printing is particularly suitable for forming a patterned light-emitting layer. A device may be inkjet printed by providing a patterned layer over the first electrode and defining wells for printing. The patterned layer is preferably a layer of photoresist that is patterned to define wells as described in, for example, EP 0880303.

As an alternative to wells, the ink may be printed into channels defined within a patterned layer. In particular, the photoresist may be patterned to form channels which, unlike wells, extend over a plurality of pixels and which may be closed or open at the channel ends.

The same coating and printing methods may be used to form other layers of an OLED including (where present) a hole injection layer, a charge transporting layer and a charge blocking layer.

Applications

An organic light-emitting diode containing a light-emitting layer comprising the composition as described herein may be used, without limitation, in night vision goggles, sensors and CMOS chips. A sensor may comprise one or more OLED as described herein and at least one photodetector device, the or each photodetector device being configured to detect emission from the one more OLEDs. Optionally, the OLED of a sensor, preferably the OLED of a wearable sensor, has an operating voltage of no more than 5V.

EXAMPLES

Host Monomer 1

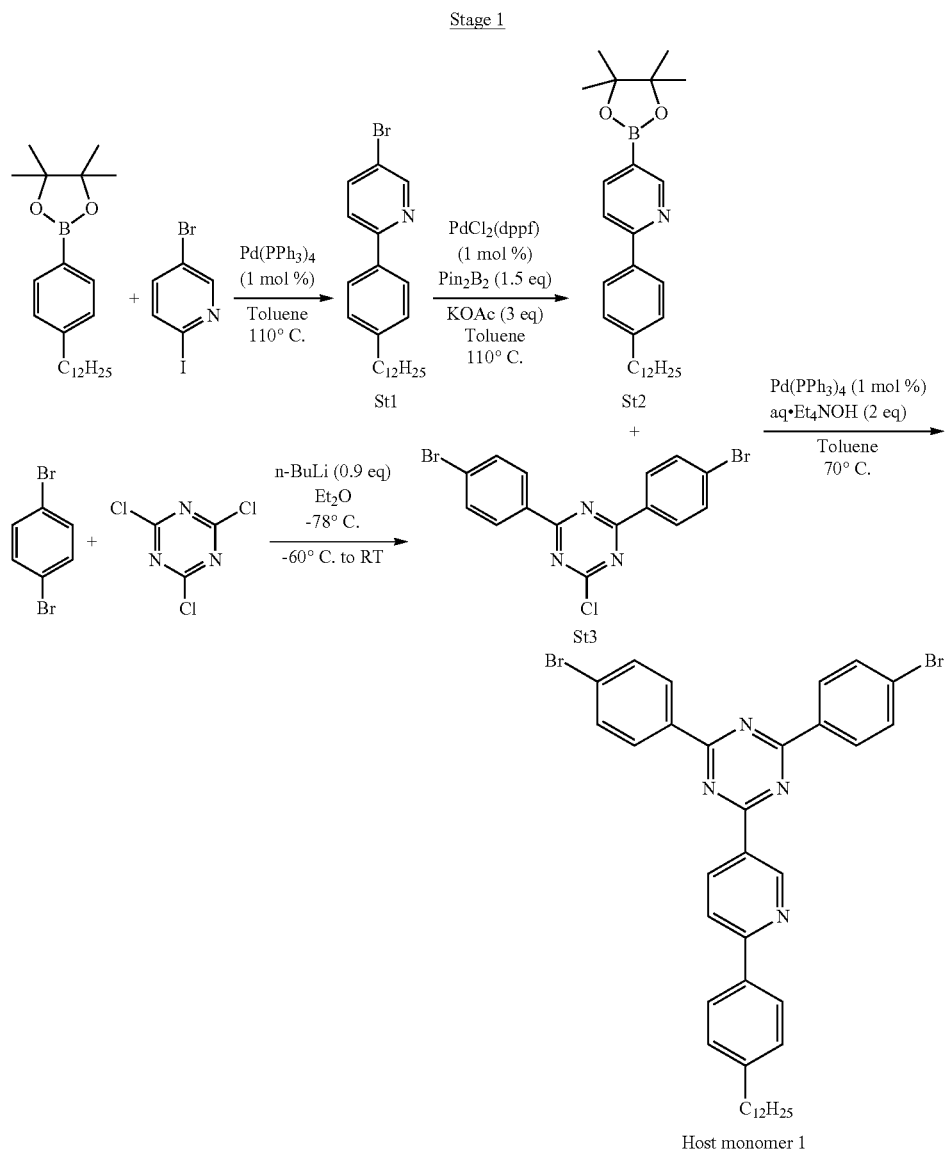

Host monomer 1

A flask was charged with aryl boronic ester (36 g, 0.097 mol), 2-iodo-5-bromopyridine (27.2 g, 0.097 mol), 25% aqueous tetraethylammonium hydroxide solution (114 mL, 0.19 mol) and toluene (400 mL). The mixture was purged with nitrogen for 2 h before palladium tetrakis(triphenylphosphine) (1.1 g, 0.96 mmol) was added and the reaction was stirred at 110° C. for 18 h. After cooling the reaction mixture was filtered through a bed of Celite which was further washed with ethyl acetate. The combined filtrate was washed with water twice, dried with sodium sulfate, filtered and concentrated. The crude product was purified by column chromatography on silica gel eluting with ethyl acetate in hexanes. The product-containing fractions were combined and concentrated before being recrystallized twice from toluene/acetonitrile to yield the product (30 g, 99.24% HPLC). 1H-NMR (400 MHz, CDCl$_3$): δ [ppm] δ 0.89 (t, J=6.8 Hz, 3H), 1.26-1.33 (m, 18H), 1.61-1.67 (m, 2H), 2.67 (t, J=7.2 Hz, 2H), 7.29 (d, J=8.4 Hz, 2H), 7.61 (d, J=8.4 Hz, 1H), 7.88 (d, J=8.0 Hz, 2H), 7.85 (d, J=2.0 Hz, 1H), 8.72 (d, J=2.0 Hz, 1H).

Stage 2

A flask was charged with stage 1 material (31 g, 0.077 mol), B2pin2 (29.1 g, 0.115 mol), potassium acetate (22.6 g, 0.23 mol) and toluene (300 mL). The mixture was purged with nitrogen for 2 h before [1,1'-Bis(diphenylphosphino)ferrocene]dichloropalladium(II) (0.62 g, 0.77 mmol) was added and the reaction was stirred at 100° C. for 18 h. After cooling, the mixture was filtered through a bed of Celite which was further washed with ethyl acetate. The combined filtrate was washed with water and concentrated. The crude product was recrystallized twice from toluene/acetonitrile to give the product (26 g, 99.08% HPLC). 1H-NMR (400 MHz, CDCl3): δ [ppm] δ 0.89 (t, J=7.2 Hz, 3H), 1.27-1.33 (m, 18H), 1.39 (s, 12H), 1.64-1.67 (m, 2H), 2.68 (t, J=7.2

Hz, 2H), 7.29 (d, J=8.0 Hz, 2H), 7.72 (dd, J=1.2 Hz, 8.0 Hz, 1H), 7.96 (d, J=8.0 Hz, 2H), 8.12 (dd, J=1.2 Hz, 8.0 Hz,1H), 9.02 (s, 1H).

Stage 3

A flask was charged with 1,4-dibromobenzene (200 g, 0.85 mol) and diethyl ether (1.5 L). The solution was cooled to <−70° C. under nitrogen and a solution of n-butyllithium in hexane (305 mL, 2.5 M, 0.764 mol) was added dropwise and the solution was stirred for 3 h.

A separate flask was charged with cyanuric chloride (70.4 g, 0.38 mol) and diethyl ether (500 mL). The solution was cooled to <−70° C. The lithiated solution in the first flask was transferred via cannula into the cyanuric chloride solution at such a rate to maintain the temperature <−70° C. After the addition the reaction mixture was maintained <−70° C. for 2 h before being allowed to warm to r.t. The solid produced was isolated by filtration and washed with water. The crude product was recrystallized seven times from toluene to give the product (80.5 g, >99% HPLC). 1H-NMR (400 MHz, CDCl3): δ [ppm] δ 7.71 (d, J=8.8 Hz, 4H), 8.49 (d, J=8.8 Hz, 4H).

Host Monomer 1

A flask was charged with stage 2 material (10 g, 22 mmol), stage 3 material (9.4 g, 22 mmol), 25% aqueous tetraethylammonium hydroxide solution (26 mL, 44 mmol) and toluene (100 mL). The mixture was purged with nitrogen for 2 h before palladium tetrakis(triphenylphosphine) (0.25 g, 0.22 mmol) was added and the reaction was stirred at 70° C. for 18 h. After cooling the reaction mixture was filtered through a bed of Celite which was further washed with ethyl acetate. The combined filtrate was washed with water twice, dried with sodium sulfate, filtered and concentrated. The crude product was purified by column chromatography on silica gel eluting with ethyl acetate in hexanes. The product-containing fractions were combined and concentrated before being recrystallized twice from toluene/acetonitrile to yield the product (7.0 g, 99.79% HPLC). 1H-NMR (400 MHz, CDCl3): δ [ppm] δ 0.89 (t, J=7.2 Hz, 3H), 1.27-1.36 (m, 18H), 1.64-1.67 (m, 2H), 2.70 (t, J=7.2 Hz, 2H), 7.35 (d, J=8.0 Hz, 2H), 7.72 (d, J=8.4 Hz, 4H), 7.91 (d, J=8.4 Hz, 1H), 8.07 (d, J=8.0 Hz, 2H), 8.61 (d, J=8.4 Hz, 4H), 8.95 (d, J=8.0 Hz, 1H), 9.95 (s, 1H).

Host Monomer 2

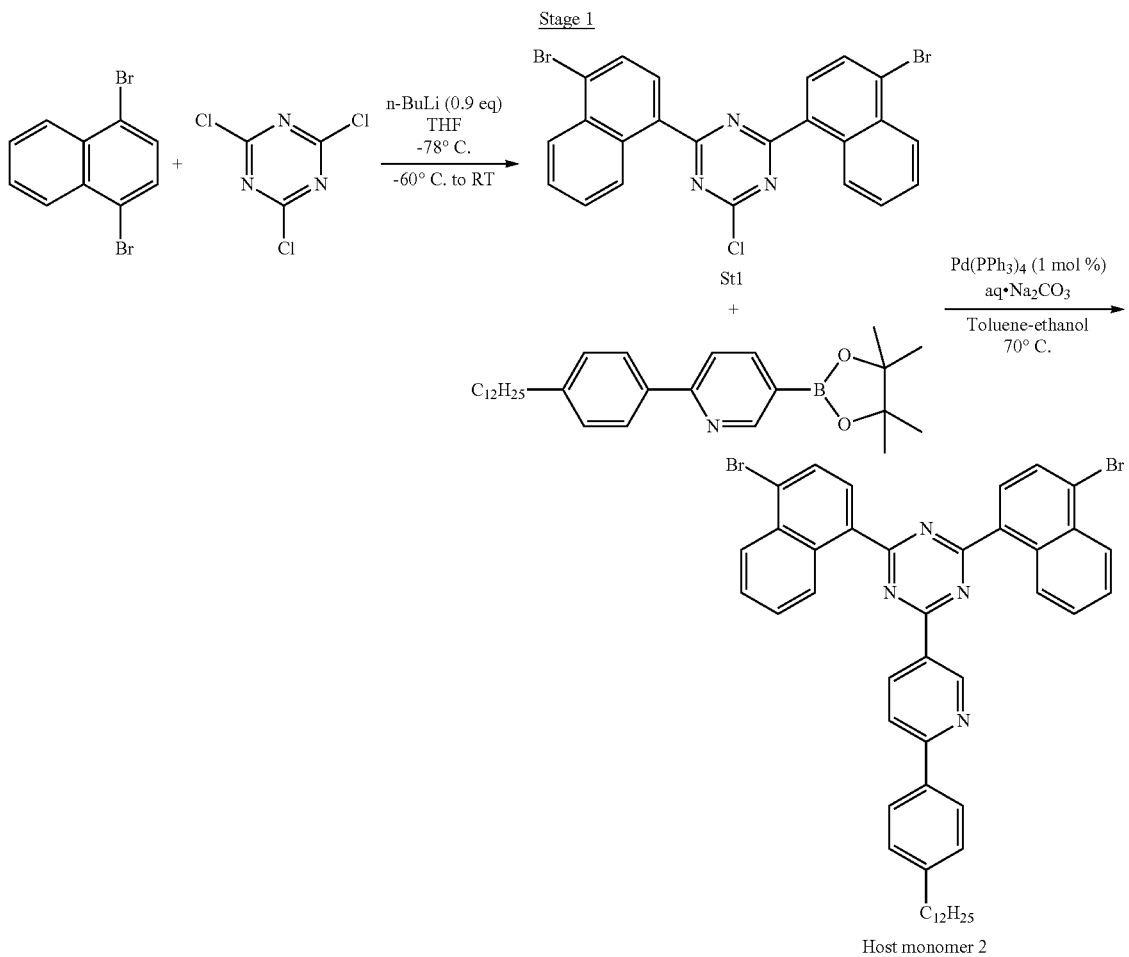

Host monomer 2

A flask was charged with 1,4-dibromonapthalene (47.8 g, 167 mmol) and THF (600 mL). The solution was cooled to <−70° C. under nitrogen and a solution of n-butyllithium in hexane (100 mL, 1.6 M, 164 mmol) was added dropwise and the solution was stirred for 3 h.

A separate flask was charged with cyanuric chloride (15.1 g, 82 mmol) and THF (425 mL). The solution was cooled to <−70° C. The lithiated solution in the first flask was transferred via cannula into the cyanuric chloride solution at such a rate to maintain the temperature <−70° C. After the addition the reaction mixture was maintained <−70° C. for 2 h before being allowed to warm to r.t. The reaction was quenched with aqueous ammonium chloride and the reaction mixture was concentrated. Chloroform was added and the organics were washed with water three times before being dried with sodium sulfate, filtered and concentrated. The crude product was triturated in ethanol and recrystallized from toluene to give the product (22.8 g, ~87% HPLC). The material was used without further purification.

Host Monomer 2

A flask was charged with Host monomer 1 stage 2 material (9 g, 19.2 mmol), stage 1 material (15.8 g, 27 mmol), ethanol (237 mL) and toluene (1.7 L). The mixture was purged with nitrogen for 2 h before palladium tetrakis (triphenylphosphine) (1.85 g, 1.6 mmol) was added and the reaction was stirred at 75° C. A degassed aqueous sodium carbonate solution (6.36 g in 480 mL water) was added dropwise and the reaction was stirred for 4 h. After cooling the layers were separated and the organics were washed with water twice, dried with sodium sulfate, filtered and concentrated. The crude product was dissolved in hot toluene and filtered through a pad of silica. The solvent was removed and the residue was recrystallized twice from toluene/acetonitrile and then stirred twice with activated charcoal in toluene at 70° C. for 1 h. The charcoal was removed by filtration through a Celite pad. The material was further purified by column chromatography in silica eluting with chloroform in hexanes and recycling GPC. Finally the material was recrystallized twice from toluene/acetonitrile to yield the product (5.6 g, 99.65% HPLC). 1H-NMR (600 MHz, CDCl3): δ [ppm] δ 0.88 (t, J=7.1 Hz, 3H), 1.27-1.35 (m, 18H), 1.64-1.67 (m, 2H), 2.69 (t, J=7.5 Hz, 2H), 7.35 (d, J=8.1 Hz, 2H), 7.70 (m, 4H), 7.94 (d, J=8.4 Hz, 1H), 8.00 (d, J=7.9 Hz, 2H), 8.07 (d, J=8.4 Hz, 2H), 8.40 (d, J=7.9 Hz, 2H), 8.45 (d, J=7.4 Hz, 2H), 8.98 (d, J=8.4 Hz, 1H), 9.99 (s, 1H).

Infrared Emitter 1

Infrared Emitter 1 was prepared according to Scheme 1

Scheme 1

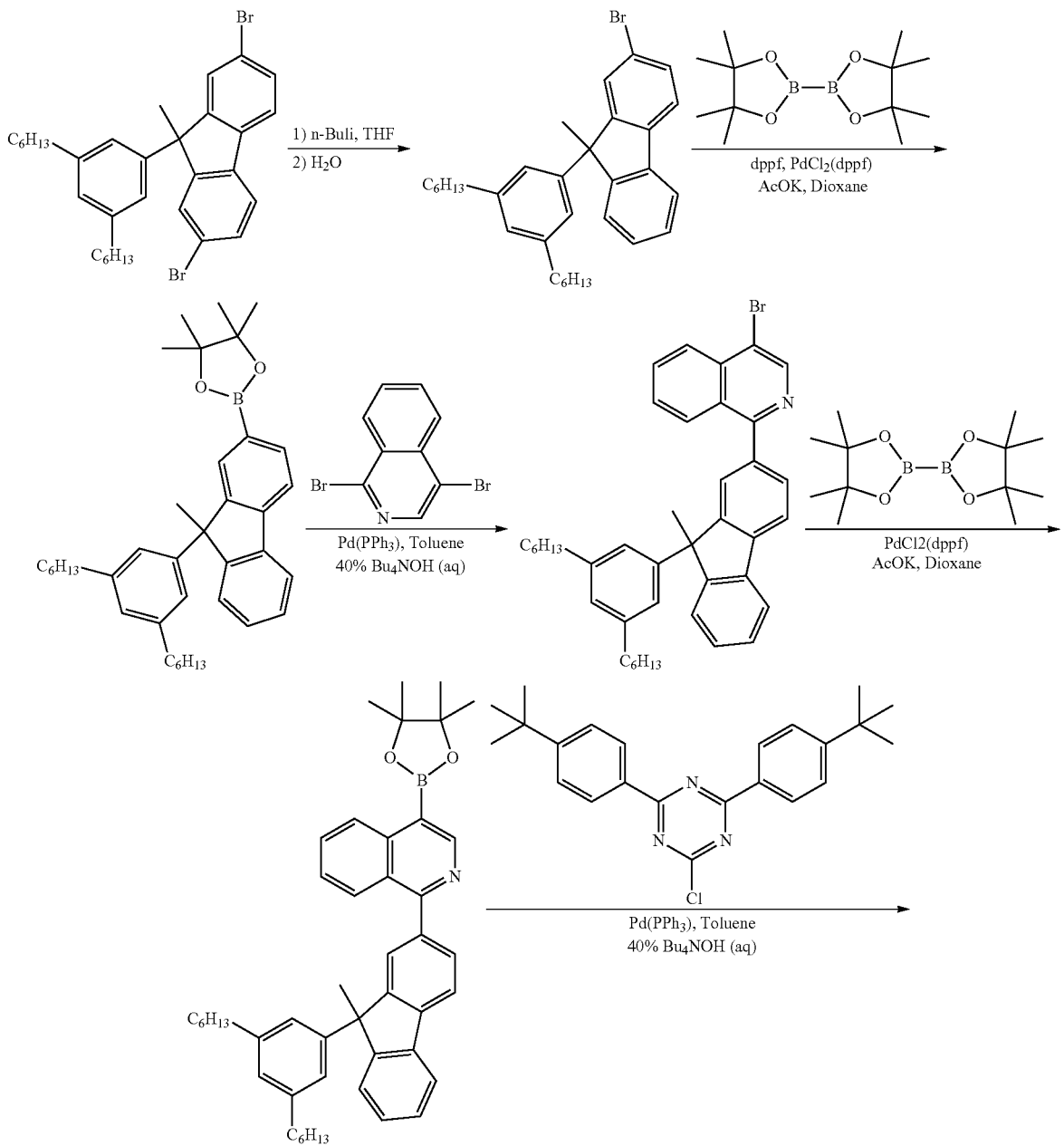

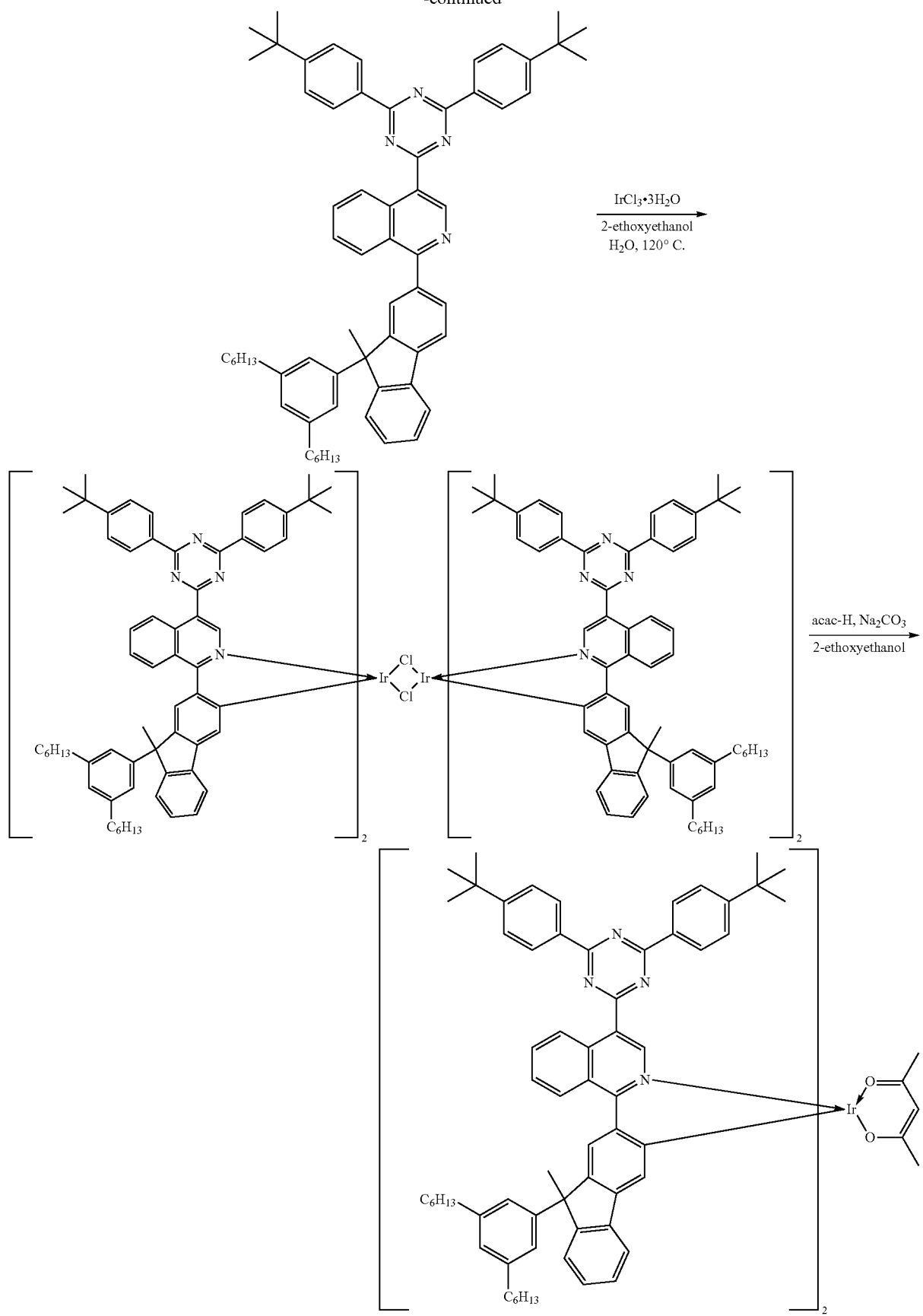

2-Bromo-9-(3,5-dihexylphenyl)-9-methyl-9H-fluorene

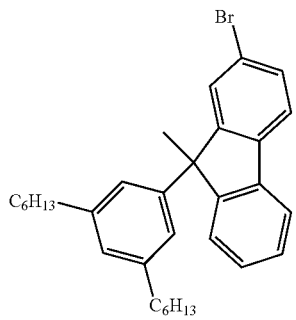

An oven dried 3 L four neck flask fitted with nitrogen inlet, overhead stirrer and dropping funnel was charged with 2,7-dibromo-9-(3,5-dihexylphenyl)-9-methyl-9H-fluorene (71.0 g, 121.90 mmol). Air was replaced with nitrogen for 30 min. Anhydrous THF (710 ml) was added and the flask was cooled down to −78° C. using dry ice/acetone bath. A solution of n-BuLi (2.5M, 40.0 ml, 100 mmol, 0.82 equiv.) was added dropwise over a period of 30 min and stirred for 1 hr. GC-MS analysis of crude sample showed that it contained ~30% starting dibromide. A further of 0.41 equivt of nBuLi (2.5M, 20.0 ml, 50 mmol) was added and stirred continued for 1.5 hr at −78° C. GC-MS analysis showed no starting material left. The reaction mixture was allowed to warm to −45° C. and quenched with careful dropwise addition of 100 ml of water then allowed to increase temperature to RT overnight. The reaction was stopped and transferred to a separatory funnel. Heptane (500 ml) and water (200 ml) were added and allowed to separate. The organic layer was successively washed with 10% NaCl (aq.) solution (100 ml×3) and with water (200 ml×3) then dried over MgSO$_4$ and filtered. The solvent was evaporated to about 150 ml then passed through a small pad of silica and eluted with heptane. The crude material was purified by column chromatography using heptane as eluent (30.8 g, colourless oil, 49.8% yield, 98.8% HPLC).

$^1$H-NMR (600 MHz, CDCl$_3$, TMS): δ=7.74 (m, 1H), 7.61(m, 1H), 7.45(m, 1H), 7.34(m, 2H), 7.21 (m, 2H), 6.8(m, 3H), 2.46(t, 4H), 1.82(s, 3H), 1.47 (m, 4H), 1.26(m, 12H), 0.86(t, 6H).

2-(9-(3,5-Dihexylphenyl)-9-methyl-9H-fluoren-2-yl)-4,4,5,5-tetramethyl-1,3,2-dioxaborolane

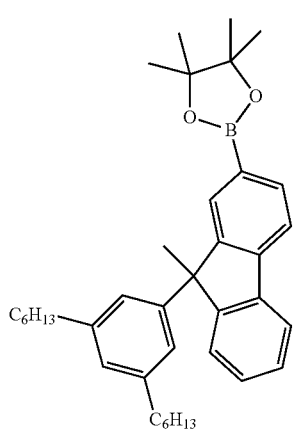

In a 1 L three neck flask fitted with nitrogen inlet and condenser were placed 2-bromo-9-(3,5-dihexylphenyl)-9-methyl-9H-fluorene (30.7 g, 60.97 mmol) and bis(pinacolato)diboron (17.03 g, 67.06 mmol, 1.10 equivt). Anhydrous dioxane (300 ml) was added and nitrogen was bubbled through the solution for 30 min. A suspension of dppf (1.01 g, 1.83 mmol) and PdCl$_2$(dppf).CH$_2$Cl$_2$ (1.49 g, 1.83 mmol) was added to the reaction mixture. Nitrogen bubbling was continued for another 30 min. Potassium acetate (17.95 g, 182.9 mmol, 3.0 equivt) was added as solid and the reaction mixture was heated to 110° C. for 16 hr. The reaction was stopped and allowed to cool to room temperature. It was then diluted with 200 ml EtOAc and transferred to a separatory funnel and allowed to separate. The organic layer was then washed with water (500 ml×3) and brine (200 ml×3) and dried over MgSO$_4$. Evaporation of solvent and purification by silica column using 40% CH$_2$Cl$_2$/heptane gives the ester, (20.3 g, 97.61% HPLC, 61.5% yield) a viscous liquid which solidified on standing for few days.

$^1$H-NMR (600 MHz, CDCl$_3$, TMS): δ=7.82 (m, 1H), 7.70(m, 1H), 7.46(m, 1H), 7.35(m, 2H), 7.20 (m, 2H), 6.82(m, 3H), 2.46(t, 4H), 1.88(s, 3H), 1.48 (m, 4H), 1.42 (s, 12H), 1.22(m, 12H), 0.85(t, 6H).

1,4-Dibromoisoquinoline

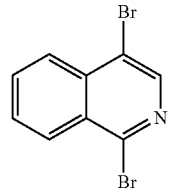 [SMILES: Brc1cnc(Br)c2ccccc12]

In a 250 ml three neck flask fitted with overhead stirrer and condenser which is also connected to a scrubber solution, 1-hydroxyisoquinoline (10. g, 68.89 mmol) and PBr$_5$ (53.38 g, 124 mmol) were taken. The reaction mixture was gradually heated to 140° C. At about 125° C.-130° C. the solid melts and a deep read solution obtained which on further heating converts to yellowish solid at ~135° C. The reaction mixture was heated at this temperature for 10 min then allowed to cool to room temperature. The pale yellow solid was crushed and added in portions into ice with stirring to obtain a pale yellow powder which was filtered and washed with water (150 ml) and dried in an oven at 50° C. under vacuum. The crude solid was purified by recrystallisation from EtOAc/heptane (14.1 g, 99.93% HPLC, 71.3% yield). $^1$H-NMR (600 MHz, CDCl$_3$, TMS): δ=8.47 (s, 1H), 8.32(d, 1H), 8.19 (m, 1H), 7.72(m, 1H).

4-Bromo-1-(9-(3,5-dihexylphenyl)-9-methyl-9H-fluoren-2-yl)isoquinoline

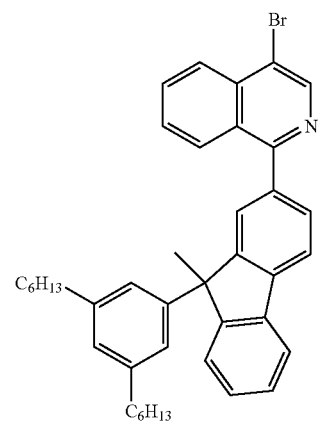

In a 1 L three neck flask fitted with nitrogen bubbler, overhead stirrer and condenser were taken 2-(9-(3,5-dihexylphenyl)-9-methyl-9H-fluoren-2-yl)-4,4,5,5-tetramethyl-1,3,2-dioxaborolane (20.0 g, 36.32 mmol), 1,4-dibromoisoquinoline (10.42 g, 36.32 mmol), toluene (200 ml), t-BuOH (100 ml) and THF (130 ml). To this mixture 40% aq. solution of n-Bu4NOH (100 ml, 145 mmol) was added followed by water (50 ml). Nitrogen was bubbled through the reaction mixture for 1 hr. The catalyst, $Pd(Ph_3P)_4$ (1.26 g, 1.09 mmol) was to the reaction mixture and heated to 50° C. for 16 hr. The reaction was stopped and transferred to a separatory funnel and diluted with 200 ml of EtOAc and allowed to separate. The aqueous layer was extracted with EtOAc and the combined organic layer was washed with water (200 ml×3) and brine (200 ml×2). It was then dried over $MgSO_4$, evapourated to dryness and purified by silica column using 50% $CH_2Cl_2$/heptane as eluent (18.2, 99.13% HPLC, 79.4% yield, viscous liq.). $^1$H-NMR (600 MHz, $CDCl_3$, TMS): δ=8.77 (s, 1H), 8.27(d, 1H), 8.02 (d, 1H), 7.92(d, 1H), 7.85 (d, 1H), 7.77(m, 1H), 7.68 (d, 1H), 7.53(m, 2H), 7.39 (m, 1H), 7.30(d, 2H), 6.81 (m, 3H), 2.46(t, 4H), 1.92(s, 3H), 1.48 (m, 4H), 1.21(m, 12H), 0.81(t, 6H).

1-(9-(3,5-Dihexylphenyl)-9-methyl-9H-fluoren-2-yl)-4-(4,4,5,5-tetramethyl-1,3,2-dioxaborolan-2-yl)isoquinoline

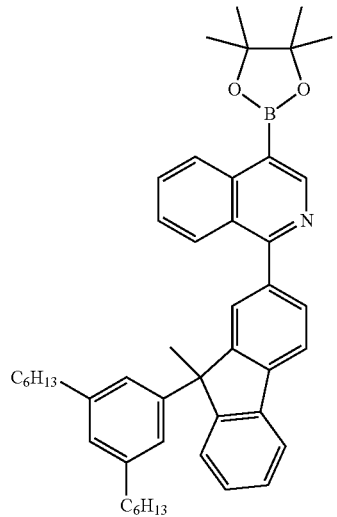

In a 1 L three neck flask fitted with nitrogen inlet and condenser 4-bromo-1-(9-(3,5-dihexylphenyl)-9-methyl-9H-fluoren-2-yl)isoquinoline (21.96 g, 34.81 mmol), bis(pinacolato)diboron (9.72 g, 38.29 mmol, 1.10 equivt) and potassium acetate (10.25 g, 104.43 mmol, 3.0 equivt) were taken. Anhydrous dioxane (220 ml) was added and nitrogen was bubbled through the solution for 45 min. A suspension of $PdCl_2$(dppf).CH2Cl2 (0.850 g, 1.04 mmol, 0.03 equivt) in dioxane was added into the reaction flask and nitrogen bubbling was continued for another 15 min. The reaction mixture was heated to 110° C., the progress of reaction was monitored by HPLC analysis. After 16 hrs it still contained starting material, bis(pinacolato)diboron (0.886 g, 3.48 mmol, 0.1 equvt) and fresh catalyst (0.01 eqvt) were added and heated for additional 24 hr. HPLC analysis showed no starting material left then the reaction was stopped and allowed to cool to room temperature. It was then diluted with 200 ml EtOAc and transferred to a separatory funnel. It was then washed with water (400 ml×3) and brine (200 ml×3) and dried over $MgSO_4$. Evaporation of solvent gave a dark brown tar which was redissoved in EtOAc (200 ml) and treated with charcoal (40 g) twice and filtered. Evaporation of the solvent gives light brownish oil (20.92 g, 97.11% HPLC, 88.5% yield). $^1$H-NMR (600 MHz, $CDCl_3$, TMS): δ=9.02 (s, 1H), 8.74(d, 1H), 8.02 (d, 1H), 7.92 (d, 1H), 7.84(d, 1H), 7.69 (m, 2H), 7.57(s, 1H), 7.40 (m, 2H), 7.29(m, 2H), 6.8 (m, 3H), 2.46(t, 4H), 1.92(s, 3H), 1.49 (m, 4H), 1.43 (s, 12H), 1.20(m, 12H), 0.83 (t, 6H).

4-(4,6-bis(4-(tert-butyl)phenyl)-1,3,5-triazin-2-yl)-1-(9-(3,5-dihexylphenyl)-9-methyl-9H-fluoren-2-yl)isoquinoline

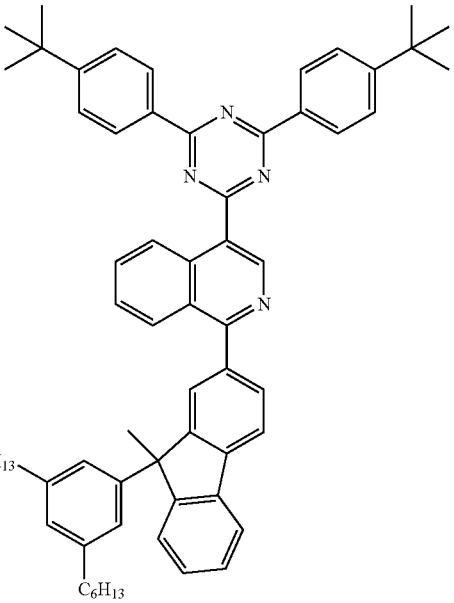

In a 1 L three neck flask fitted with nitrogen bubbler, overhead stirrer and condenser 1-(9-(3,5-dihexylphenyl)-9-methyl-9H-fluoren-2-yl)-4-(4,4,5,5-tetramethyl-1,3,2-dioxaborolan-2-yl)isoquinoline (20.92 g, 30.87 mmol), 2,4-bis(4-(tert-butyl)phenyl)-6-chloro-1,3,5-triazine(10.55 g, 27.78 mmol, 0.9 equivt), toluene (200 ml) and 20% aq. solution of n-Et$_4$NOH (90 ml, 123 mmol) was added. Nitrogen was bubbled through the reaction mixture for 1 hr. To the reaction mixture $Pd(Ph_3P)_4$ (1.07 g, 0.93 mmol) was added and nitrogen bubbling was continued for another 15 min then heated to 70° C. for 16 hr. Sampling showed no 2,4-bis(4-(tert-butyl)phenyl)-6-chloro-1,3,5-triazine left then the reaction was stopped, cooled down to room temperature and transferred to a separatory funnel. The aqueous layer was extracted with EtOAc and the combined organic layer was washed with water (200 ml×3) and brine (200 ml×2). It was then dried over $MgSO_4$, evaporated to dryness and purified by silica column using 30% $CH_2Cl_2$/heptane as eluent giving pale yellowish liquid. The product was further purified and solidified by stirring in methanol and repeatedly precipitated from $CH_2Cl_2$/MeOH (13.5 g, pale yellow powder, 99.5% HPLC, 51.5% yield). $^1$H-NMR (600 MHz, $CDCl_3$, TMS): δ=9.62 (s, 1H), 9.30(d, 1H), 8.7 (d, 4H), 8.17(d, 1H), 7.97 (d, 1H), 7.88(d, 1H), 7.81 (m, 2H), 7.68(s, 1H), 7.62 (d, 4H), 7.54(m, 1H), 7.41 (m, 1H), 7.32(m, 2H), 6.8 (m, 3H), 2.47(t, 4H), 1.96(s, 3H), 1.51 (m, 4H), 1.41 (s, 18H), 1.25(m, 12H), 0.83 (t, 6H).

Ir{4-(4,6-bis(4-(tert-butyl)phenyl)-1,3,5-triazin-2-yl)-1-(9-(3,5-dihexylphenyl)-9-methyl-9H-fluoren-2-yl)isoquinoline}2acac

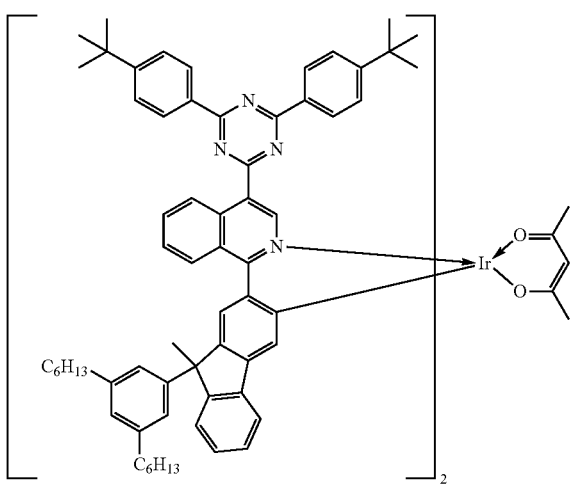

In a 250 ml three neck flask fitted with overhead stirrer, nitrogen inlet and condenser 4-(4,6-bis(4-(tert-butyl)phenyl)-1,3,5-triazin-2-yl)-1-(9-(3,5-dihexylphenyl)-9-methyl-9H-fluoren-2-yl)isoquinoline (6.5 g, 7.26 mmol), IrCl3.3H2O (1.02 g, 2.90 mmol), 2-ethoxy ethanol (70 ml) and water (23 ml) were taken. Nitrogen was bubbled through the reaction mixture for 1 hr then heated to 120° C. for 16 hr before cooldown to room temperature. The solid was filtered, washed with water and dried in oven at 50° C. under vacuum. The material was used for the next step without further purification.

A 250 ml three neck flask fitted with overhead stirrer, nitrogen inlet and condenser was charged with the material from previous step (6.5 g, 2.96 mmol), acetyl acetone (8.890 g, 88.8 mmol, 30 equivt) and 2-ethoxy ethanol (100 ml). Nitrogen was bubbled through the reaction mixture for 1 hr then solid Na$_2$CO$_3$ (2.83 g, 26.64 mmol, 9 equivt) was added into the flask. The reaction mixture was heated to 120° C. for 16 hr before cooldown to room temperature. Water (60 ml) was added to precipitate the solid which was filtered, washed with water and dried in oven at 50° C. under vacuum. The material was purified by silica gel column chromatography using 30% CH$_2$Cl$_2$/heptane as eluent. The main diastereomer was collected and further purified by precipitation from CH$_2$Cl$_2$/MeOH (1.56 g, >99.5% HPLC).

$^1$H-NMR (600 MHz, THF-d$_8$): δ=9.75 (s, 1H), 9.72(s, 1H), 9.67 (s, 1H), 9.66(s, 1H), 8.97 (m, 2H), 8.73(m, 8H), 8.23 (s, 1H), 8.19(s, 1H), 7.94 (m, 2H), 7.82(m, 2H), 7.61(m, 8H), 7.06(m, 14H), 6.75 (s, 1H), 6.73(s, 1H), 5.43 (s, 1H), 2.39(m, 8H), 1.82(m, 12H), 1.47(m, 8H), 1.37 (m, 36H), 1.2 (m, 24H), 0.83 (t, 6H), 0.79 (t, 6H).

Infrared Emitter 1 has a LUMO level of −3.10 eV

Infrared Emitter 2

Infrared Emitter 2 was prepared according to the following scheme:

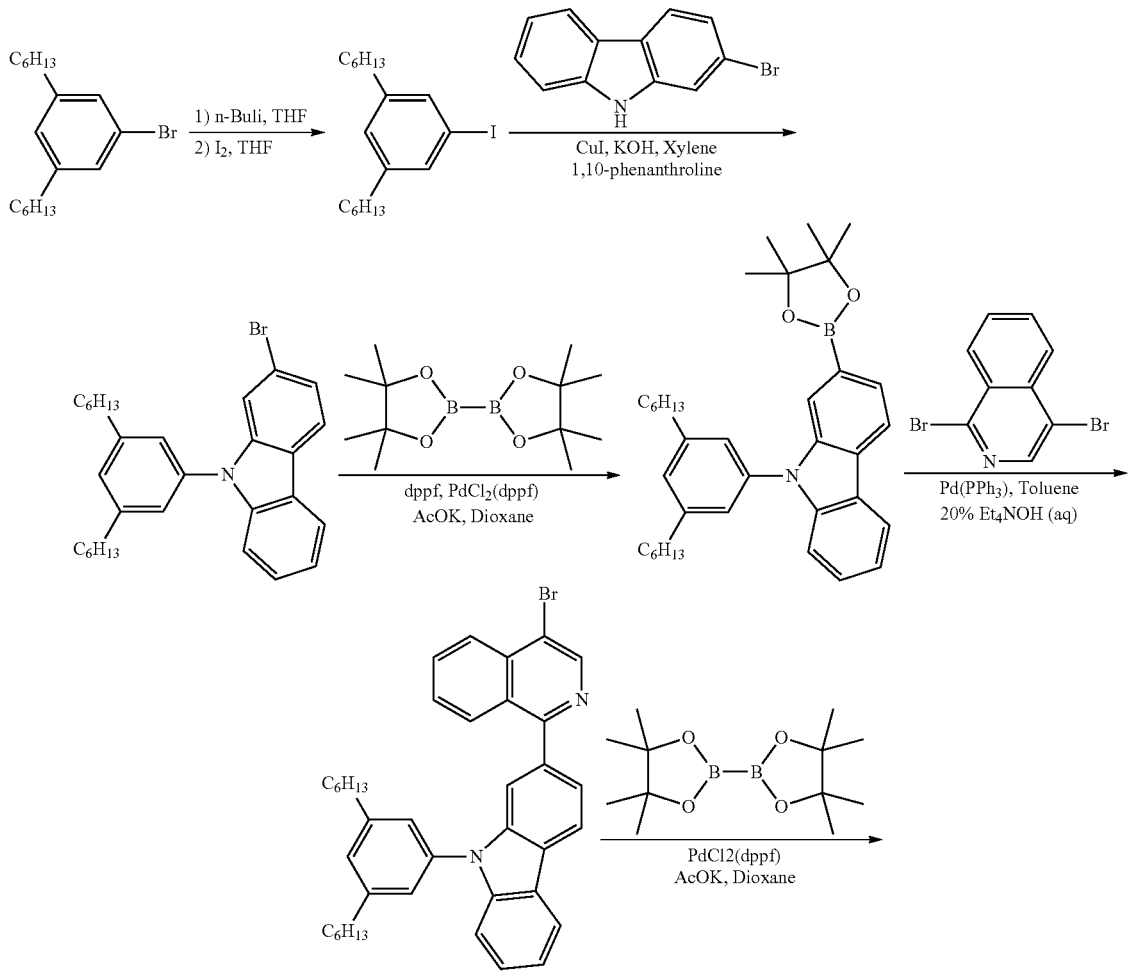

-continued
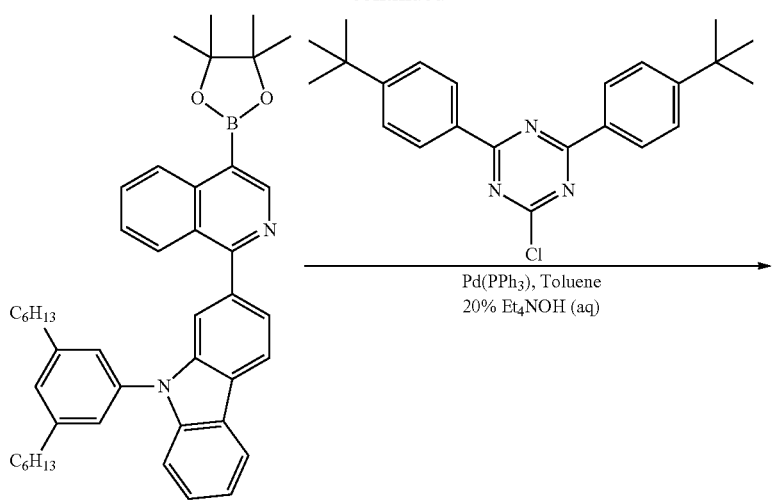
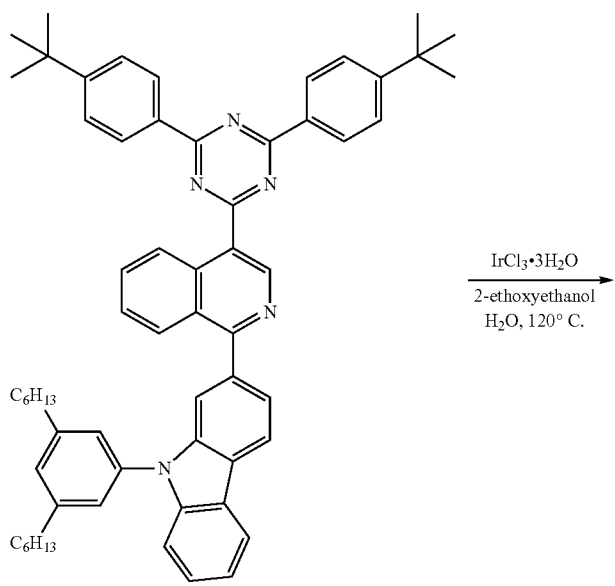
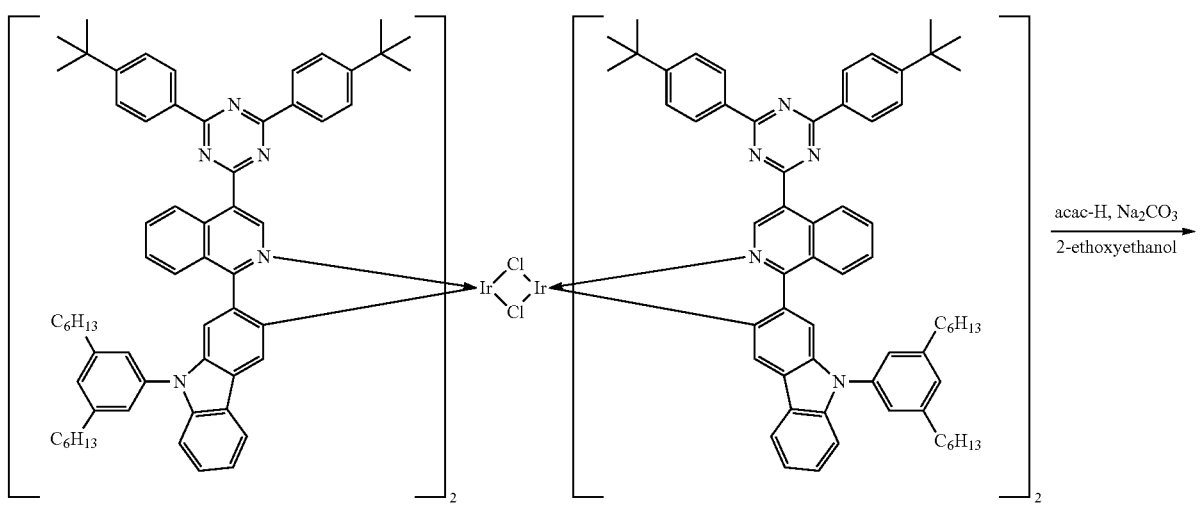

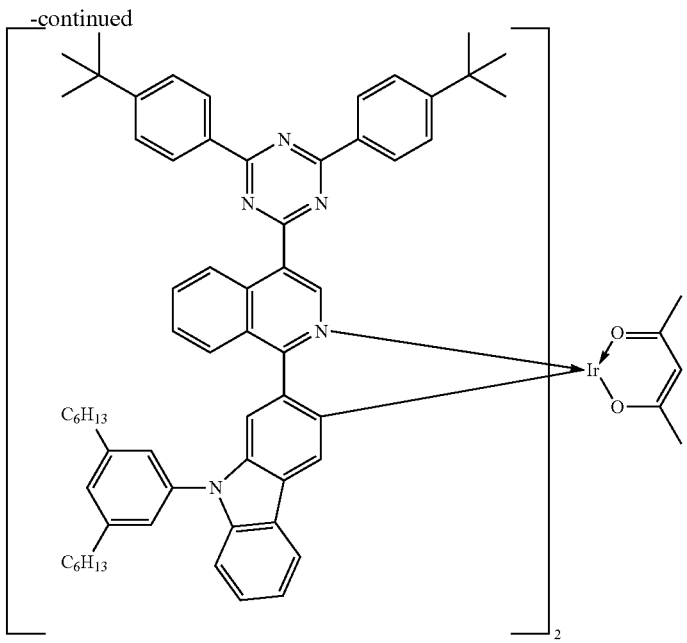

An oven dried 2 L four neck flask fitted with nitrogen inlet, overhead stirrer and dropping funnel was charged with 1-bromo-3,5-dihexylbenzene (50.0 g, 153.69 mmol). Air was replaced with nitrogen for 30 min. Anhydrous THF (400 ml) was added and the flask was cooled down to −78° C. using dry ice/acetone bath. A solution of n-BuLi (2.5M, 80.0 ml, 200 mmol, 1.3 equivt.) was added dropwise over a period of 30 min and stirred for 1 hr at −78° C. A THF solution (150 ml) of iodine (50.71 g, 200 mmol) was added dropwise into the reaction mixture at −78° C. then allowed to warm to room temperature and stirred for 16 hr. The reaction was quenched with aqueous sodium thiosulphate solution (200 ml) then transferred to a separatory funnel. The aqueous layer was extracted with heptane and the combined organic layers were washed with water (200 ml×2) and brine (200 ml×2). It was then dried over MgSO$_4$ and concentrated to about 200 ml then passed through a pad of silica and eluted with heptane. The solvent was evaporated and dried in oven at 50° C. under vacuum (49.5 g, 64% yield). GC-MS analysis shows it contains traces of starting bromide. The material was used for the next step without further purification.

$^1$H-NMR (600 MHz, THF-d$_8$): δ=7.34 (s, 2H), 6.92(s, 1H), 2.50(t, 4H), 1.56 (m, 4H), 1.2 (m, 12H), 0.88 (t, 6H).

1,3-dihexyl-5-iodobenzene

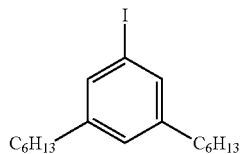

2-bromo-9-(3,5-dihexylphenyl)-9H-carbazole

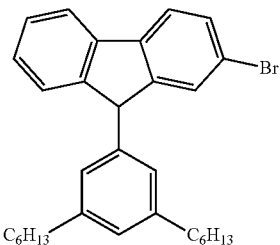

A 2 L flask fitted with overhead stirrer and condenser was charged with 1,3-dihexyl-5-iodobenzene (9.0 g, 36.57 mmol) and 2-bromocarbazole (27.23 g, 73.14 mmol, 2 equivt). O-xylene (370 ml) was added and stirred. Nitrogen was bubbled through the suspension for 1 hr then KOH pellets (5.13 g, 91.42 mmol, 2.5 equivt) was added and stirred for 10 min. CuCl (1.08 g, 10.9 mmol, 0.3 equivt) was added followed by 1,10-phenanthroline (3.95 g, 21.91 mmol, 0.6 equivt), a brownish cloudy solution obtained. The reaction mixture heated to 100° C. for 1 hr then the rest of CuCl (0.73 g, 7.37 mmol-0.2 equivt) and 1,10-phenanthroline (2.64 g, 14.34 mmol, 0.4 equivt) were added. The temperature of the reaction mixture was increased to 140° C. and heated for 20 hr. TLC showed no bromocarbazole remained. The reaction was allowed to cool to room temperature which resulted in the formation of a large amount of black precipitate. Water (300 ml) was added and stirred for 10 min then transferred to a separatory funnel and allowed to separate. The aqueous layer was extracted with EtOAc and the combined organic layer was washed with water (200 ml×2) and brine (200 ml×2), dried over MgSO$_4$, evaporated to dryness, a brownish liquid which was purified by silica column using heptane as eluent (17.05 g, colorless oil, 99.75% HPLC, 95% yield).

¹H-NMR (600 MHz, CDCl₃, TMS): δ=8.10 (d, 1H), 7.98(d, 1H), 7.52 (d, 1H), 7.42(m, 1H), 7.37 (m, 2H), 7.29(m, 1H), 7.13 (m, 3H), 2.69(t, 4H), 1.68(m, 4H), 1.36 (m, 12H), 0.90(t, 6H).

9-(3,5-Dihexylphenyl)-2-(4,4,5,5-tetramethyl-1,3,2-dioxaborolan-2-yl)-9H-carbazole

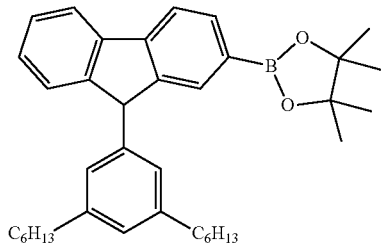

In a 1 L three neck flask fitted with nitrogen inlet and condenser 2-bromo-9-(3,5-dihexylphenyl)-9H-carbazole (17.0 g, 34.66 mmol) and bis(pinacolato)diboron (9.68 g, 38.12 mmol, 1.10 equivt) were taken. Anhydrous dioxane (300 ml) was added and nitrogen was bubbled through the solution for 30 min. A suspension of dppf (0.58 g, 1.04 mmol) and PdCl₂(dppf).CH₂Cl₂ (0.85 g, 1.04 mmol) was added to the reaction mixture. Nitrogen bubbling was continued for another 30 min. Potassium acetate (10.20 g, 103.97 mmol, 3.0 equivt) was added as solid and the reaction mixture was heated to 110° C. for 16 hr, a pale brownish solution obtained. The reaction was stopped and cooldown to room temperature. It was then diluted with 200 ml EtOAc and transferred to a separatory funnel and allowed to separate. The organic layer was washed with water (200 ml×3) and brine (150 ml) and dried over MgSO₄. The solvent was evaporated to dryness giving a pale brown liquid which was diluted with heptane and passed through a pad of celite/florosil (20 g/20 g) and eluted with heptane. Evaporation of solvent gives light yellowish liquid (17.08 g, 99.4% HPLC, 92% yield).

¹H-NMR (600 MHz, CDCl₃, TMS): δ=8.15 (m, 2H), 7.8(s, 1H), 7.73 (m, 1H), 7.40(m, 2H), 7.2 (m, 1H), 7.16(s, 2H), 7.10 (s, 1H), 2.69(t, 4H), 1.69(m, 4H), 1.37(m, 24H), 0.89(t, 6H).

2-(4-bromoisoquinolin-1-yl)-9-(3,5-dihexylphenyl)-9H-carbazole

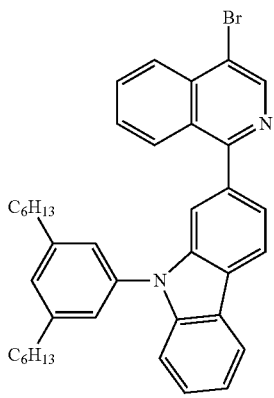

In a 1 L three neck flask fitted with nitrogen bubbler, overhead stirrer and condenser were taken 9-(3,5-Dihexylphenyl)-2-(4,4,5,5-tetramethyl-1,3,2-dioxaborolan-2-yl)-9H-carbazole (17.08 g, 30.94 mmol), 1,4-dibromoisoquinoline (9.26 g, 32.27 mmol), toluene (170 ml), t-BuOH (85 ml) and THF (111 ml). To this mixture 40% aq. solution of n-Bu₄NOH (80 ml, 123 mmol) was added followed by water (42 ml). Nitrogen was bubbled through the reaction mixture for 1 hr. The catalyst, Pd(Ph₃P)₄ (1.07 g, 0.93 mmol) was to the reaction mixture and heated to 50° C. for 16 hr. The reaction was stopped and transferred to a separatory funnel and diluted with 200 ml of EtOAc and allowed to separate. The aqueous layer was extracted with EtOAc and the combined organic layer was washed with water (200 ml×3) and brine (200 ml×2). It was then dried over MgSO₄, evaporated to dryness and purified by silica column using 40% CH₂Cl₂/heptane as eluent (16.2, 99.65% HPLC, 83% yield, pale brown oil).

¹H-NMR (600 MHz, CDCl₃, TMS): δ=8.78 (s, 1H), 8.23(m, 4H), 7.81 (m, 1H), 7.71(s, 1H), 7.56 (m, 2H), 7.4(m, 2H), 7.32 (m, 1H), 7.21(s, 2H), 7.05 (s, 1H), 2.64(t, 4H), 1.62(m, 4H), 1.33(m, 4H), 1.24(m, 8H), 0.84(t, 6H).

9-(3,5-dihexylphenyl)-2-(4-(4,4,5,5-tetramethyl-1,3,2-dioxaborolan-2-yl)isoquinolin-1-yl)-9H-carbazole

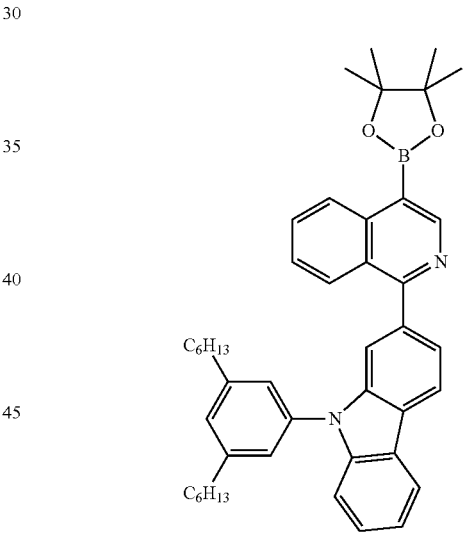

In a 1 L three neck flask fitted with nitrogen inlet and condenser 2-(4-bromoisoquinolin-1-yl)-9-(3,5-dihexylphenyl)-9H-carbazole (15.86 g, 25.68 mmol), bis(pinacolato)diboron (7.17 g, 28.24 mmol, 1.10 equivt) and potassium acetate (7.56 g, 77.03 mmol, 3.0 equivt) were taken. Anhydrous dioxane (160 ml) was added and nitrogen was bubble through the solution for 45 min. A suspension of PdCl₂(dppf).CH₂Cl₂ (0.630 g, 0.77 mmol, 0.03 equivt) in dioxane was added into the reaction flask and nitrogen bubbling was continued for another 15 min. The reaction mixture was heated to 110° C., the progress of reaction was monitored by HPLC analysis and once no starting material left then it was stopped and cooldown to room temperature. It was then diluted with 150 ml EtOAc and transferred to a separatory funnel. It was then washed with water (300 ml×3) and brine (150 ml×2) and dried over MgSO₄. Evaporation of solvent giving brown tar which was redissoved in toluene (100 ml) and passed through a pad of celite/florosil (30 g/50 g) and eluted with 1 L of toluene. Evaporation of the solvent gives light brownish oil (12 g, 97% HPLC, 67% yield). The material was used for the next step without further purification.

¹H-NMR (600 MHz, CDCl₃, TMS): δ=9.03 (s, 1H), 8.70(d, 1H), 8.23 (m, 3H), 7.17 (m, 2H), 7.49(m, 4H), 7.32 (m, 1H), 7.22(s, 2H), 7.03 (s, 1H), 2.63(t, 4H), 1.61(m, 4H), 1.44(s, 12H), 1.32(m, 4H), 1.24(m, 8H), 0.84(t, 6H).

2-(4-(4,6-bis(4-(tert-butyl)phenyl)-1,3,5-triazin-2-yl) isoquinolin-1-yl)-9-(3,5-dihexylphenyl)-9H-carbazole

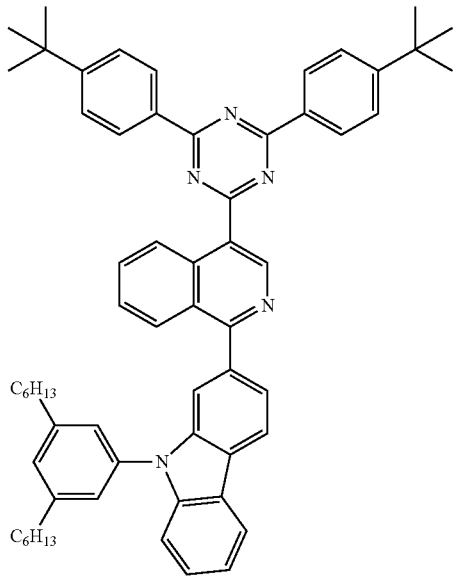

In a 1 L three neck flask fitted with nitrogen bubbler, overhead stirrer and condenser 9-(3,5-dihexylphenyl)-2-(4-(4,4,5,5-tetramethyl-1,3,2-dioxaborolan-2-yl)isoquinolin-1-yl)-9H-carbazole (11.00 g, 14.54 mmol), 2,4-bis(4-(tert-butyl)phenyl)-6-chloro-1,3,5-triazine (5.52 g, 14.54 mmol, 1.0 equivt), toluene (110 ml) and 20% aq. solution of n-4NOH (42 ml, 58.16 mmol) was added. Nitrogen was bubbled through the reaction mixture for 1 hr. To the reaction mixture Pd(Ph₃P)₄ (0.5 g, 0.44 mmol) was added and nitrogen bubbling was continued for another 15 min then heated to 70° C. for 16 hr. Sampling shows no starting materials left then the reaction was stopped, cool down to RT and transferred to a separatory funnel. The aqueous layer was extracted with EtOAc and the combined organic layer was washed with water (100 ml×3) and brine (100 ml×2). It was then dried over MgSO₄, evaporated to dryness and purified by silica column using 30% CH₂Cl₂/heptane as eluent giving pale pale yellowish liquid. The product was further purified and solidified by stirring in methanol and repeatedly precipitated from CH₂Cl₂/MeOH (11.8 g, pale yellowish powder, 99.49% HPLC, 81.5% yield).

¹H-NMR (600 MHz, CDCl₃, TMS): δ=9.03 (s, 1H), 8.76(d, 1H), 8.22 (m, 4H), 7.70(m, 3H), 7.58 (m, 1H), 7.45(m, 4H), 7.31 (m, 1H), 7.25(m, 6H), 7.16 (m, 1H), 7.03(s, 1H), 2.63(t, 4H), 1.62(m, 4H), 1.44(m, 12H), 1.27(m, 18H), 0.84(t, 6H).

Ir{2-(4-(4,6-bis(4-(tert-butyl)phenyl)-1,3,5-triazin-2-yl)isoquinolin-1-yl)-9-(3,5-dihexylphenyl)-9H-carbazole}₂ acac

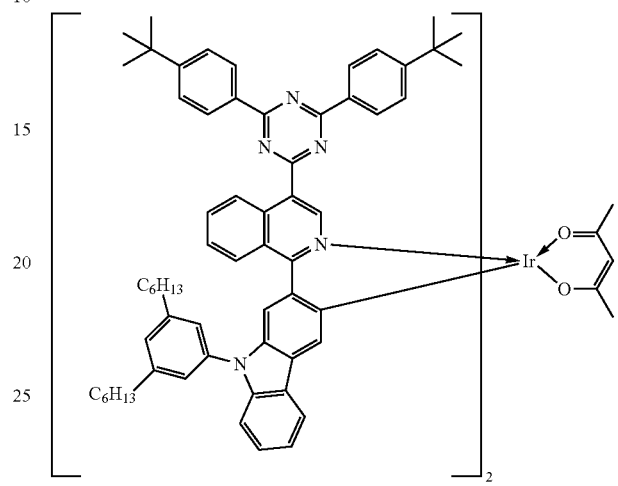

In a 100 ml three neck flask fitted with overhead stirrer, nitrogen inlet and condenser 2-(4-(4,6-bis(4-(tert-butyl)phenyl)-1,3,5-triazin-2-yl)isoquinolin-1-yl)-9-(3,5-dihexylphenyl)-9H-carbazole (1.3 g, 1.47 mmol), IrCl₃.3H2O (0.24 g, 0.67 mmol), 2-ethoxy ethanol (25 ml) and water (8 ml) were taken. Nitrogen was bubbled through the reaction mixture for 1 hr then heated to 120° C. for 16 hr before cooldown to room temperature. The solid was filtered, washed with water and dried in oven at 50° C. under vacuum. The material was used for the next step without further purification.

A 100 ml three neck flask fitted with overhead stirrer, nitrogen inlet and condenser was charged with the material from previous step (1.42 g, 0.64 mmol), acetyl acetone (1.92 g, 19.21 mmol, 30 equivt) and 2-ethoxy ethanol (40 ml). Nitrogen was bubbled through the reaction mixture for 1 hr then solid Na₂CO₃ (0.61 g, 5.76 mmol, 9 equivt) was added into the flask. The reaction mixture was heated to 120° C. for 16 hr before cooldown to room temperature. Water (50 ml) was added to precipitate the solid which was filtered, washed with water and MeOH and dried in oven at 50° C. under vacuum. The material was purified by silica gel column chromatography using 40% CH₂Cl₂/heptane as eluent. The product further purified by precipitation from CH₂Cl₂/MeOH (0.34 g, 99.5% HPLC, 26% yield).

¹H-NMR (600 MHz, CDCl₃, TMS): δ=9.75 (s, 2H), 9.55(d, 2H), 9.03 (d, 2H), 8.72(d, 8H), 8.42 (s, 2H), 7.86(m, 2H), 7.72 (m, 2H), 7.56(m, 10H), 7.31 (s, 2H), 7.19(m, 8H), 7.04(s, 2H), 6.89(m, 2H), 5.40 (s, 1H), 2.60(t, 8H), 1.87(s, 6H), 1.70(m, 8H), 1.35 (m, 66H), 0.90 (t, 6H).

Infrared Emitter 2 has a LUMO level of −3.08 eV.

Host Materials

Host polymers were prepared by Suzuki polymerisation as described in WO 00/53656 of monomers as set out in Table 1.

TABLE 1

| Monomer | Example Host 1 (mol %) | Comparative Host 1 (mol %) |
|---|---|---|
| ![fluorene bis-pinacol boronate with C6H13 groups] | 36 | 36 |
| ![fluorene bis-pinacol boronate with C8H17 groups] | 14 | 14 |
| ![2,7-dibromofluorene with C6H13-phenyl groups] | 12.5 | 12.5 |
| ![bis(4-bromophenyl) diamine with dimethyl tert-butyl phenyl groups] | 7.5 | 7.5 |
| ![triazine with two 4-bromophenyl groups and pyridyl-C12H25-phenyl] | 30 | 0 |

TABLE 1-continued

| Monomer | Example Host 1 (mol %) | Comparative Host 1 (mol %) |
|---|---|---|
| Br-C6H4-C(=N-)-N=C(-C6H4-Br)-N=C-C6H4-C12H25 (2,4-bis(4-bromophenyl)-6-(4-dodecylphenyl)-1,3,5-triazine) | 0 | 30 |

Device Example 1

An infrared emitting OLED having the following structure was prepared:

ITO/HIL (64 nm)/HTL (20 nm)/LEL (70 nm)/Cathode in which ITO is an indium tin oxide anode; HIL is a hole-injection layer; HTL is a hole-transporting layer; and LEL is a light-emitting layer.

To form the device, a substrate carrying ITO was cleaned using UV/Ozone. The hole injection layer was formed by spin-coating an aqueous formulation of a hole-injection material and heating the resultant layer. The hole transporting layer was formed by spin-coating Hole-Transporting Polymer 1 and crosslinking the polymer by heating. The light-emitting layer was formed by spin-coating composition of Infrared Emitter 1 (7.5 wt %) and Example Host 1 (92.5 wt %) from toluene solution. The cathode was formed by evaporation of a first layer of sodium fluoride to a thickness of about 3.5 nm, a second layer of magnesium to a thickness of about 1 nm and a third layer of silver to a thickness of about 200 nm.

Hole Transporting Polymer 1 was formed by Suzuki polymerisation as described in WO 00/53656 of fluorene repeat units of formula (VIII); amine repeat units of formula (VI-1); and crosslinkable repeat units of formula (VIII).

Comparative Device 1

A comparative device was formed by the same process except that Example Host 1 was Comparative Host 1.

The properties of Device Example 1 and Comparative Device 1 were measured at a current density of 50 mA/cm² and are set out in Table 2. Device Example 1 has a slightly higher drive voltage than Comparative Device 1 but a much higher external quantum efficiency and radiant power.

TABLE 2

| Device | Voltage (V) | EQE (%) | Radiant power (mW/cm²) |
|---|---|---|---|
| Comparative Device 1 | 7.81 | 5.14 | 4.28 |
| Device Example 1 | 8.0 | 8.4 | 6.98 |

Figure 2:
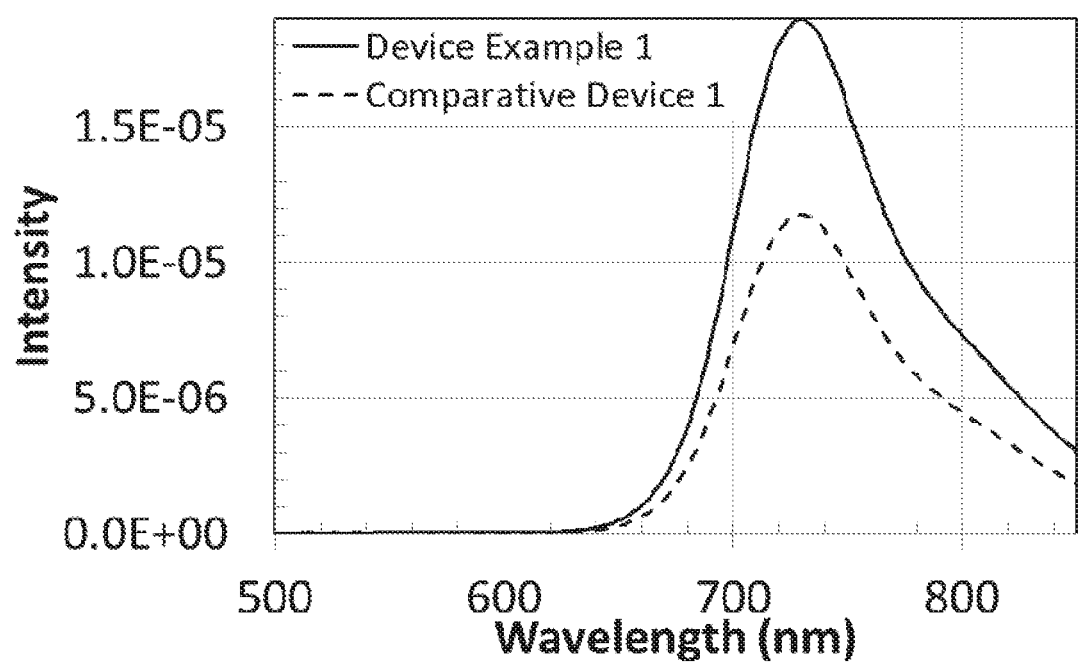
FIG. 2 is the electroluminescence spectra for a device according to an embodiment of the invention and a comparative device in which the devices have a peak emission wavelength of about 725 nm.

With reference to FIG. 2, Device Example 1 and Comparative Device 1 have similar peak wavelengths however the intensity of Device Example 1 is greater under the same driving conditions.

Device Example 2

An infrared emitting OLED was prepared as described for Device Example 1 except that the light-emitting layer was formed from a composition comprising Example Host 1 (95 wt %) and Infrared Emitter 2 (5 wt %).

Comparative Device 2

An infrared emitting OLED was prepared as described for Device Example 2 except that Comparative Host 1 was used in place of Example Host 1.

The properties of Device Example 2 and Comparative Device 2 were measured at a current density of 50 mA/cm² and are set out in Table 3. Device Example 2 has a lower drive voltage than Comparative Device 1 and higher external quantum efficiency and radiant power.

TABLE 3

| Device | Voltage (V) | EQE (%) | Radiant power (mW/cm²) |
|---|---|---|---|
| Comparative Device 2 | 8.8 | 0.9 | 0.71 |
| Device Example 2 | 7.9 | 1.2 | 0.95 |

Figure 3:
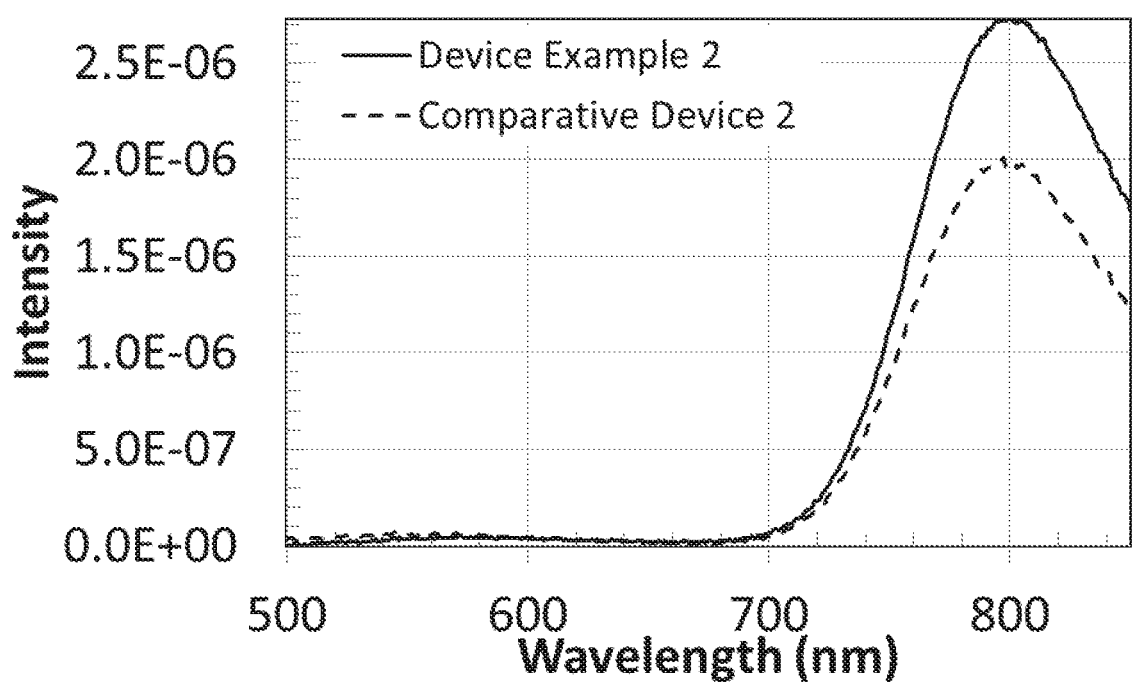
FIG. 3 is the electroluminescence spectra for a device according to an embodiment of the invention and a comparative device in which the devices have a peak emission wavelength of about 800 nm.

With reference to FIG. 3, Device Example 2 and Comparative Device 2 have similar peak wavelengths however the intensity of Device Example 2 is greater under the same driving conditions.

Device Example 3

An infrared emitting OLED was prepared as described for Device Example 1 except that the light-emitting layer was formed from a composition comprising Example Host 1 (95 wt %) and Infrared Emitter 1 (5 wt %).

Comparative Device 3

An infrared emitting OLED was prepared as described for Device Example 3 except that Comparative Host 1 was used in place of Example Host 1.

The properties of Device Example 3 and Comparative Device 3 were measured at a drive voltage of 5V. As set out in Table 4, Device Example 3 has a much higher external quantum efficiency and radiant power than Comparative Device 3.

TABLE 4

| Device | EQE (%) | Radiant power (mW/cm²) |
| --- | --- | --- |
| Comparative Device 2 | 3.9 | 0.5 |
| Device Example 2 | 6.4 | 1.7 |

Although the present invention has been described in terms of specific exemplary embodiments, it will be appreciated that various modifications, alterations and/or combinations of features disclosed herein will be apparent to those skilled in the art without departing from the scope of the invention as set forth in the following claims.

The invention claimed is:

1. A composition comprising a light-emitting compound having a peak wavelength of at least 650 nm and a material comprising a group of formula (I):

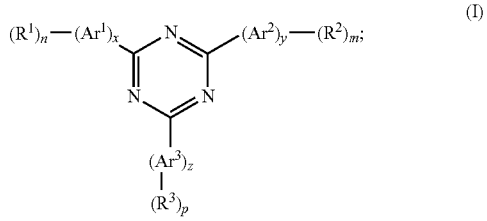

wherein $Ar^1$, $Ar^2$ and $Ar^3$ in each occurrence are independently selected from a $C_{6-20}$ aromatic group and a 6-20 membered heteroaromatic group of C and N ring atoms, and at least one of $Ar^1$, $Ar^2$ and $Ar^3$ is a 6-20 membered heteroaromatic group of C and N ring atoms;

x, y and z are each independently at least 1;

n, m and p are each independently 0 or a positive integer;

$R^1$, $R^2$ and $R^3$ in each occurrence is independently a substituent or a single bond to a polymer chain, wherein the group of formula (I) has no more than 3 single bonds to a polymer chain; and $R^1$, $R^2$ and $R^3$, if present, independently in each occurrence is selected from the group consisting of F; CN; $NO_2$; and $C_{1-20}$ alkyl wherein one or more non-adjacent, non-terminal C atoms of the alkyl group may be replaced with O, S, $NR^2$, $SiR^2_2$, COO or CO wherein $R^2$ in each occurrence is a $C_{1-20}$ hydrocarbyl group.

2. A composition according to claim 1 wherein $Ar^1$ and $Ar^2$ are each a $C_{6-20}$ aryl group and $(Ar^3)_z$ comprises a 6-20 membered heteroaromatic group of C and N ring atoms.

3. A composition according to claim 1 wherein the 6-20 membered heteroaromatic group of C and N ring atoms of formula (I) is a monocyclic 6 membered heteroaromatic group.

4. A composition according to claim 3 wherein the monocyclic 6 membered heteroaromatic group is selected from pyridine, pyrazine, pyrimidine, pyridazine, 1,2,4-triazine, 1,2,3-triazine and 1,3,5-triazine.

5. A composition according to claim 1 wherein at least one of $Ar^1$, $Ar^2$ and $Ar^3$ bound directly to the triazine group of formula (I) is a 6-20 membered heteroaromatic group of C and N ring atoms.

6. A composition according to claim 1 wherein at least one of x and y is 1.

7. A composition according to claim 1 wherein z is 1 or 2.

8. A composition according to claim 1 wherein $(Ar^3)_z$ is selected from:

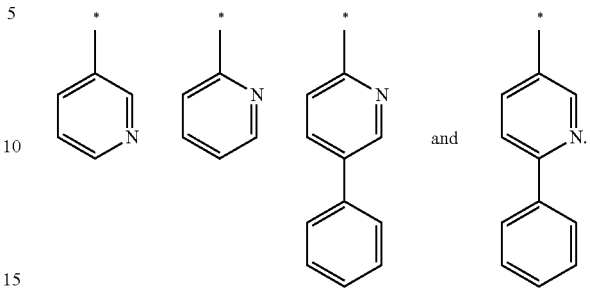

and

9. A composition according to claim 1 wherein p is at least 1.

10. A composition comprising a light-emitting compound having a peak wavelength of at least 650 nm and a material comprising a group of formula (I):

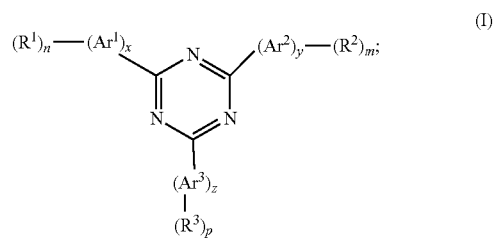

wherein $Ar^1$, $Ar^2$ and $Ar^3$ in each occurrence are independently selected from a $C_{6-20}$ aromatic group and a 6-20 membered heteroaromatic group of C and N ring atoms, and at least one of $Ar^1$, $Ar^2$ and $Ar^3$ is a 6-20 membered heteroaromatic group of C and N ring atoms;

x, y and z are each independently at least 1;

n, m and p are each independently 0 or a positive integer;

$R^1$, $R^2$ and $R^3$ in each occurrence is independently a substituent or a single bond to a polymer chain, wherein the group of formula (I) has no more than 3 single bonds to a polymer chain; and the group of formula (I) is a repeat unit and the material comprising the group of formula (I) is a polymer comprising repeat units of formula (I).

11. A composition according to claim 10 wherein the repeat units of formula (I) are selected from repeat units of formulae (Ia), (Ib), and (Ic):

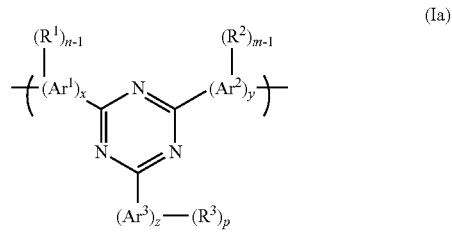

-continued

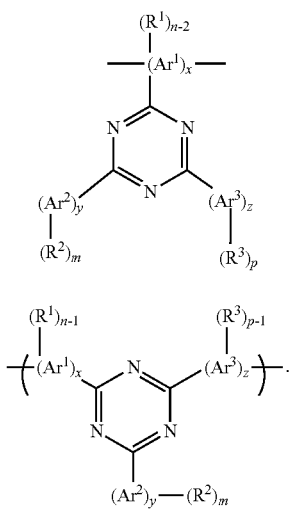

12. A composition according to claim 10 wherein the polymer comprising a repeat unit of formula (I) is a copolymer comprising one or more co-repeat units.

13. A composition according to claim 12 wherein the one or more co-repeat units comprise one or more arylamine repeat units.

14. A composition according to claim 12 wherein the one or more co-repeat units comprise one or more $C_{6-20}$ arylene repeat units.

15. A composition according to claim 1 wherein the infrared emitter is a phosphorescent emitter.

16. A solution comprising a composition according to claim 1 dissolved in one or more solvents.

17. An organic light-emitting device comprising an anode, a cathode and a light-emitting layer between the anode and cathode wherein the light-emitting layer comprises a composition according to claim 1.

18. An organic light-emitting device according to claim 17 wherein the device emits light having a wavelength in the range of 700-850 nm.

19. A method of forming an organic light-emitting device according to claim 18 comprising the step of depositing the light-emitting layer over one of the anode and cathode, and depositing the other of the anode and cathode over the light-emitting layer wherein the light-emitting layer is formed by depositing a solution comprising the composition dissolved in one or more solvents and evaporating the one or more solvents.

* * * * *